United States Patent
Furuya et al.

(10) Patent No.: US 9,522,536 B2
(45) Date of Patent: Dec. 20, 2016

(54) PIEZOELECTRIC DEVICE, LIQUID EJECTING HEAD, LIQUID EJECTING APPARATUS AND MANUFACTURING METHOD OF PIEZOELECTRIC DEVICE

(71) Applicant: Seiko Epson Corporation, Tokyo (JP)

(72) Inventors: Noboru Furuya, Chino (JP); Masao Nakayama, Shiojiri (JP); Hideki Hahiro, Yamagata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/858,382

(22) Filed: Sep. 18, 2015

(65) Prior Publication Data

US 2016/0082735 A1    Mar. 24, 2016

(30) Foreign Application Priority Data

Sep. 19, 2014  (JP) .................... 2014-191789

(51) Int. Cl.

| | |
|---|---|
| B41J 2/045 | (2006.01) |
| B41J 2/14 | (2006.01) |
| H01L 41/09 | (2006.01) |
| H01L 41/25 | (2013.01) |

(Continued)

(52) U.S. Cl.
CPC ............ *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1634* (2013.01); *B41J 2/1642* (2013.01); *B41J 2/1646* (2013.01); *H01L 41/09* (2013.01); *H01L 41/23* (2013.01); *H01L 41/25* (2013.01); *B41J 2002/1425* (2013.01); *B41J 2002/14241* (2013.01); *B41J 2002/14419* (2013.01); *B41J 2002/14491* (2013.01); *B41J 2202/11* (2013.01)

(58) Field of Classification Search
CPC . B41J 2/14274; B41J 2/14201; B41J 2/14233; B41J 2/1607; B41J 2/1612; B41J 2/1628; B41J 2/1629; B41J 2/16231
See application file for complete search history.

(56) References Cited

U.S. PATENT DOCUMENTS

| | | | |
|---|---|---|---|
| 7,274,134 B2 * | 9/2007 | Ohmori | ............... B41J 2/14209 310/340 |
| 2002/0080213 A1 | 6/2002 | Shimada et al. | |
| 2009/0219345 A1 | 9/2009 | Yazaki et al. | |

(Continued)

FOREIGN PATENT DOCUMENTS

| | | | |
|---|---|---|---|
| JP | 2000-094688 A | 4/2000 | |
| JP | 2000-141644 A | 5/2000 | |

(Continued)

*Primary Examiner* — Juanita D Jackson
(74) *Attorney, Agent, or Firm* — Harness, Dickey & Pierce, P.L.C.

(57) ABSTRACT

A piezoelectric device comprising a substrate having two surface sides; a vibration plate on one of the two surface side, a piezoelectric element including a first electrode provided on the vibration plate, a piezoelectric body layer provided on the first electrode, the piezoelectric body layer having a groove section on a side surface, the groove section including a first surface facing to the vibration plate, and a second electrode provided on the piezoelectric body layer, and a stress application film having tensile stress and provided on an inner surface of the groove section.

13 Claims, 16 Drawing Sheets

(51) Int. Cl.
*H01L 41/23* (2013.01)
*B41J 2/16* (2006.01)

(56) References Cited

U.S. PATENT DOCUMENTS

2009/0284568 A1 11/2009 Yazaki
2010/0231657 A1* 9/2010 Takahashi ........... H01L 41/0973
   347/68

FOREIGN PATENT DOCUMENTS

JP   2009-172878 A   8/2009
JP   2009-196329 A   9/2009

* cited by examiner

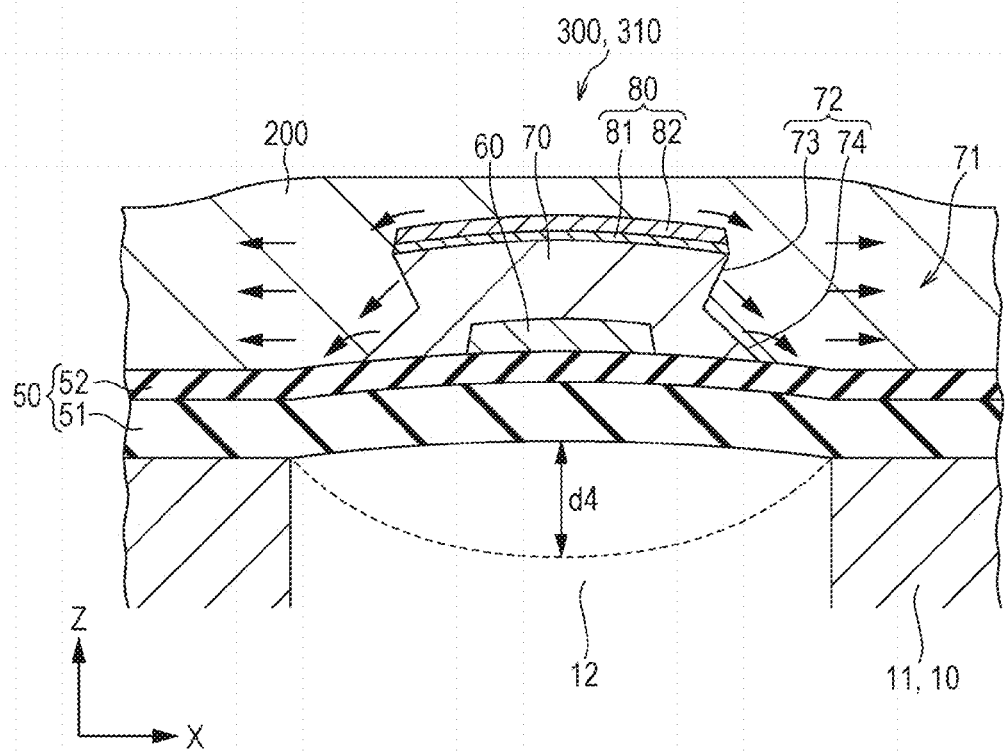

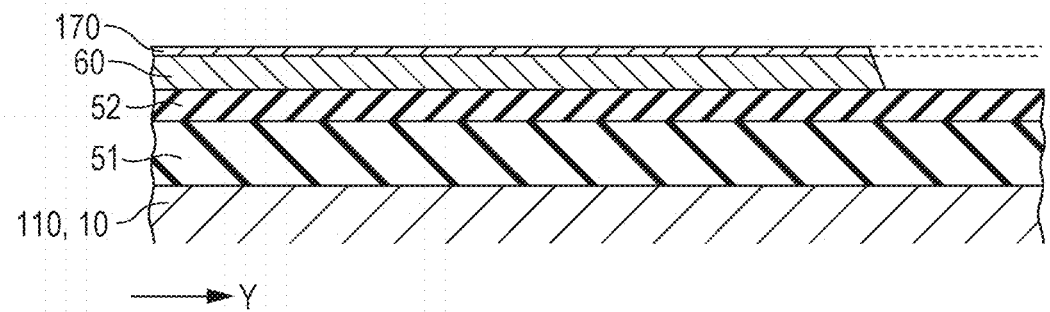
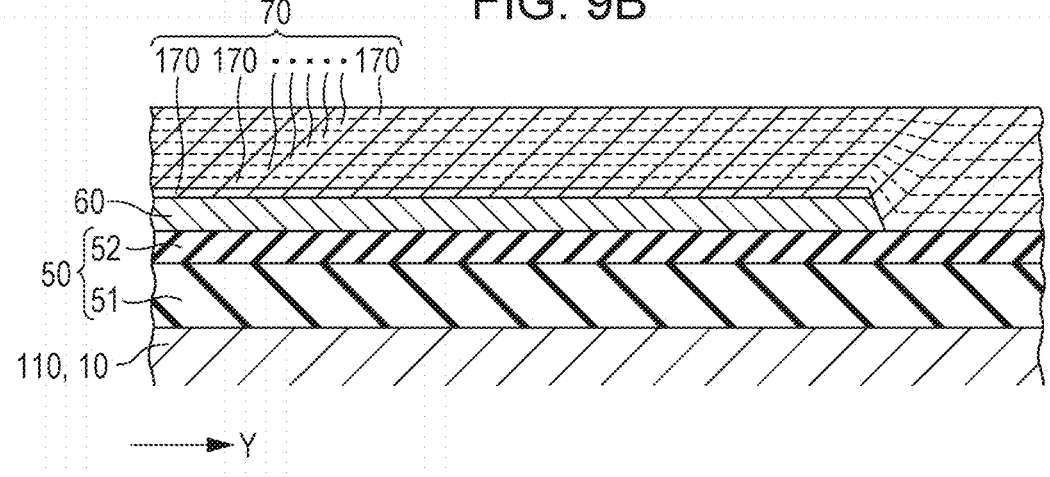

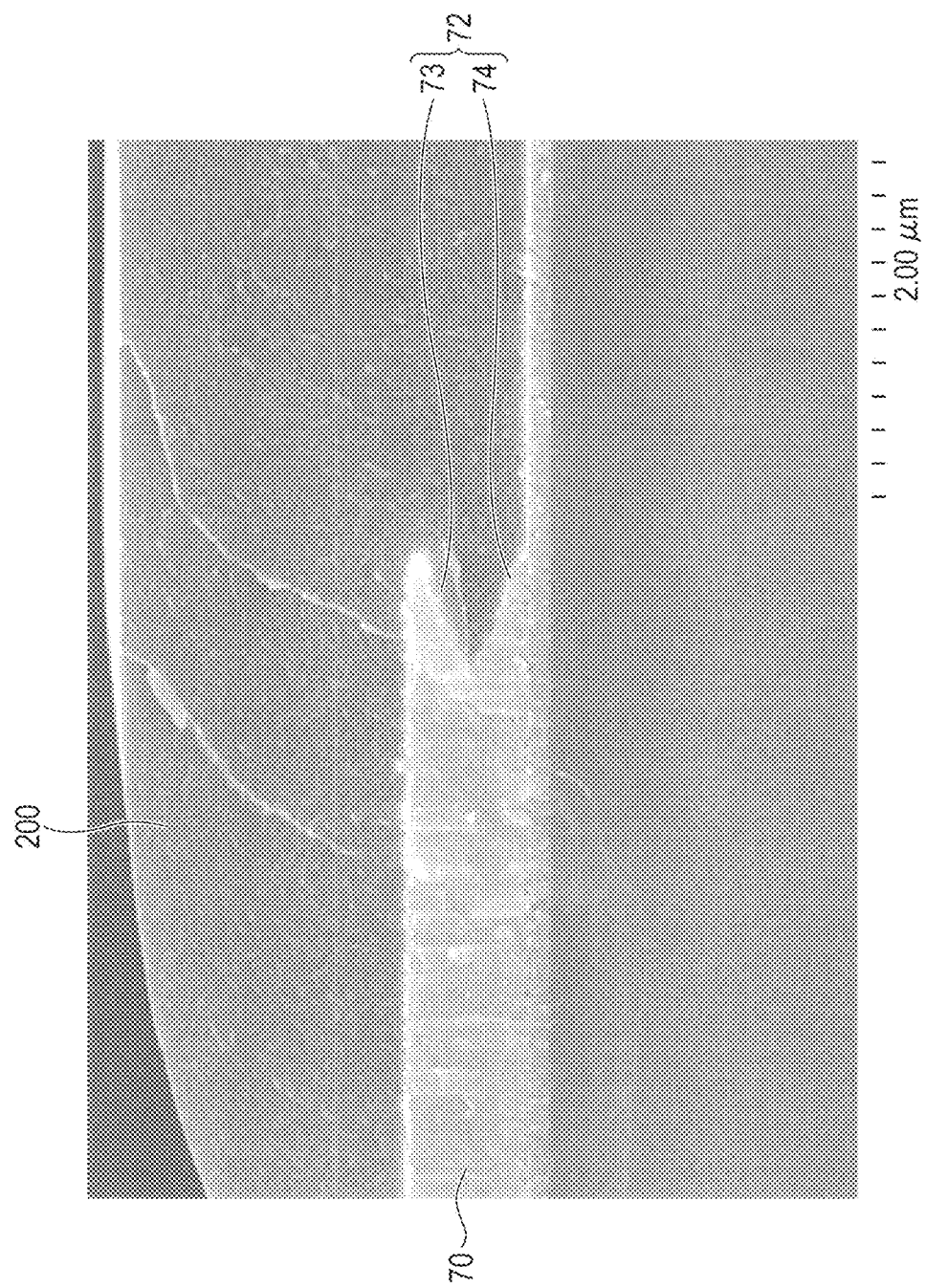

PIEZOELECTRIC DEVICE, LIQUID EJECTING HEAD, LIQUID EJECTING APPARATUS AND MANUFACTURING METHOD OF PIEZOELECTRIC DEVICE

BACKGROUND

1. Technical Field

The present invention relates to a piezoelectric device that has includes a first electrode, a piezoelectric body layer and a second electrode that are provided through a vibration plate on a substrate, liquid ejecting head provided with the piezoelectric device, a liquid ejecting apparatus provided with the liquid ejecting head, and a manufacturing method of a piezoelectric device.

2. Related Art

Liquid ejecting heads in which liquid droplets are ejected from nozzle openings that communicate with pressure generation chambers by deforming a piezoelectric devices and causing pressure fluctuations in liquid inside the pressure generation chambers, are known. Ink jet type recording heads that eject ink droplets as liquid droplets are representative examples of this kind of liquid ejecting head.

For example, ink jet type recording heads are provided with piezoelectric devices on one surface side of a flow channel formation substrate in which pressure generation chambers, which communicate with nozzle openings, are provided, and cause a pressure change in ink inside pressure generation chambers and eject ink droplets from the nozzle openings by deforming a vibration plate through driving the piezoelectric devices.

In this instance, the piezoelectric devices are provided with a first electrode, a piezoelectric body layer and a second electrode that are provided on a substrate. A piezoelectric device in which breakage due to a leakage current between the two electrodes is suppressed by providing a protective film in the piezoelectric device while setting the first electrode, which is provided on a substrate side, as a common electrode of a plurality of active sections, which effectively form a driving section, and setting the second electrode as individual electrodes of each active section, and, has been suggested (for example, refer to JP-A-2000-141644 and JP-A-2000-94688).

In addition, a piezoelectric device in which breakage due to a leakage current between the two electrodes is suppressed covering the first electrode with the piezoelectric body layer without providing a protective film while setting the first electrode, which is provided on a substrate side, as individual electrodes of each active section, setting the second electrode as a common electrode of a plurality of active sections (for example, refer to JP-A-2009-196329).

In recent years, although a so-called high displacement efficiency piezoelectric device that can obtain a large displacement at low driving voltages has been desirable, if a deformation on a substrate side is attempted by applying a voltage to the piezoelectric device in a case in which the piezoelectric device is greatly warped on the substrate side in an initial state, a displacement amount is small, and therefore, the displacement efficiency is low.

This kind of problem is not limited to piezoelectric devices that are used in liquid ejecting heads such as ink jet type recording heads, and the same problem exists in piezoelectric devices that are used in other apparatuses.

SUMMARY

An advantage of some aspects of the invention is to provide a piezoelectric device in which displacement efficiency is high, a liquid ejecting head, a liquid ejecting apparatus, and a manufacturing method of a piezoelectric device.

According to an aspect of the invention, there is provided a piezoelectric device comprising: a substrate having two surface sides; a vibration plate on one of the two surface side; a piezoelectric element including a first electrode provided on the vibration plate, a piezoelectric body layer provided on the first electrode, the piezoelectric body layer having a groove section on a side surface, the groove section including a first surface facing to the vibration plate; and a second electrode provided on the piezoelectric body layer; and a stress application film having tensile stress and provided on an inner surface of the groove section.

In this case, as a result of applying a raising stress to the piezoelectric element on a side that is opposite to the substrate, and improving stress that raises the piezoelectric element due to the first surface by forming the groove section, which has the first surface, in the piezoelectric body layer, and providing the stress application film, in which internal stress becomes tensile stress, on an inner surface of the groove section, it is possible to reduce a stress which deforms the piezoelectric element on the concave section side. Therefore, it is possible to improve a deformation amount when the piezoelectric device is driven and is deformed inside the concave section.

In this instance, it is preferable that the stress application film is provided to reach up to an upper surface of the second electrode on a side that is opposite to the piezoelectric body layer, and that an opening section is provided in a region of the stress application film that corresponds to a central section of the upper surface of the piezoelectric element. In this case, by providing the stress application film up to the upper surface of the piezoelectric element, it is possible to make a stress moment that is applied to the piezoelectric element larger, and it is possible to improve a raising effect of the piezoelectric element. In addition, by providing the opening section in the stress application film, a circumstance in which the stress application film inhibits deformation of the piezoelectric element is suppressed, and therefore, it is possible to obtain a piezoelectric element with higher displacement.

In addition, it is preferable that the first surface of the groove section is inclined with respect to a lamination direction of the first electrode, the piezoelectric body layer, and the second electrode, and the first surface of the groove section is an inclined surface that is inclined with respect to the surface of the vibration plate. In this case, it is possible to easily form the inclined first surface using wet etching or the like.

In addition, it is preferable that the groove section includes a second surface that is provided toward a side of the second electrode, the second surface is inclined with respect to a lamination direction of the first electrode, the piezoelectric body layer, and the second electrode, and the second surface is an inclined surface that is inclined with respect to the surface of the vibration plate. In this case, it is possible to easily form the inclined second surface using wet etching or the like.

In addition, it is preferable that the thickness of the stress application film from the vibration plate is greater than or equal to 100% and less than or equal to 200% with respect to the thickness of the piezoelectric element from the vibration plate. In this case, the raising effect of the piezoelectric element by the stress application film is ensured, and it is possible to suppress decreases in displacement due to repeated driving of the piezoelectric element.

In addition, it is preferable that internal stress in the second electrode is compressive stress. In this case, it is possible to further improve the raising effect of the piezoelectric element by the second electrode.

In addition, it is preferable that the stress application film is a photosensitive resin. In this case, since it is possible to form the stress application film in a predetermined shape through exposure and developing, it is possible to suppress an influence on other films due to over-etching.

Furthermore, according to another aspect of the invention, there is provided a liquid ejecting head including the piezoelectric devices according to the abovementioned aspects, in which the concave section is a pressure generation chamber, and includes nozzle openings that communicate with the pressure generation chamber and eject a liquid.

In this case, it is possible to realize a liquid ejecting head that includes a piezoelectric device with improved displacement efficiency.

In addition, according to still another aspect of the invention, there is provided a liquid ejecting apparatus including the liquid ejecting head according to the abovementioned aspect.

In this case, it is possible to realize a liquid ejecting apparatus that includes a piezoelectric device with improved displacement efficiency.

In addition, according to still another aspect of the invention, there is provided a manufacturing method of a piezoelectric device that includes preparing a substrate having two surface sides; providing a vibration plate on one of the two surface side; providing a first electrode on the vibration plate; providing a piezoelectric body layer on the first electrode, so that the piezoelectric body layer has a groove section on a side surface and that the groove section includes a first surface facing to the vibration plate; providing a second electrode on the piezoelectric body layer; and providing a stress application film having tensile stress inside, on an inner surface of the groove section.

In this case, as a result of applying a raising stress to the piezoelectric element formed at the portion where the first electrode, the piezoelectric body layer, and the second electrode are overlap, and formed on a side that is opposite to the substrate, and improving stress that raises the piezoelectric element due to the first surface by forming the groove section, which has the first surface, in the piezoelectric body layer, and providing the stress application film, in which internal stress becomes tensile stress, on an inner surface of the groove section, it is possible to reduce a stress which deforms the piezoelectric element on the concave section side. Therefore, it is possible to improve a deformation amount when the piezoelectric element is driven and is deformed inside the concave section.

In this instance, it is preferable that the groove sections are formed simultaneously by patterning the piezoelectric body layer using wet etching. In this case, it is possible to form the groove sections easily, and at low cost without increasing the number of processes.

In addition, it is preferable that the stress application film is formed by a liquid phase method. In this case, it is possible to easily form a stress application film in which the internal stress is tensile stress.

BRIEF DESCRIPTION OF THE DRAWINGS

The invention will be described with reference to the accompanying drawings, wherein like numbers reference like elements.

FIG. 7 is a cross-sectional view in which the main sections of the recording head according to the comparative example of the invention have been expanded.

FIGS. 9A and 9B are cross-sectional views that show a manufacturing method of a recording head according to Embodiment 1 of the invention.

FIG. 14 is a photograph using a scanning electron microscope according to Embodiment 1 of the invention.

DESCRIPTION OF EXEMPLARY EMBODIMENTS

Hereinafter, embodiments of the invention will be described in detail with reference to the drawings.

Embodiment 1

Figure 1:
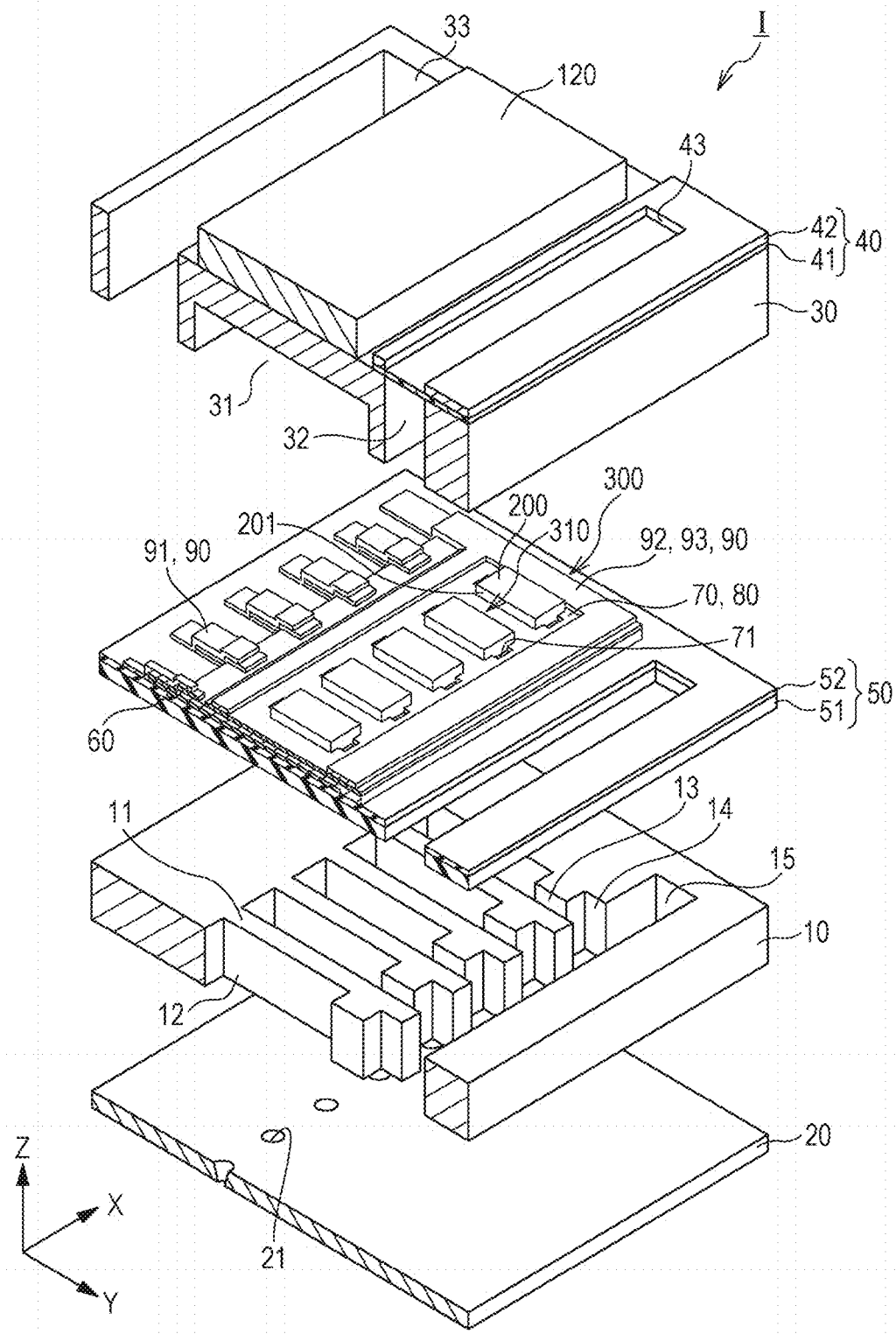
FIG. 1 is an exploded perspective view of a recording head according to Embodiment 1 of the invention.
Figure 2:
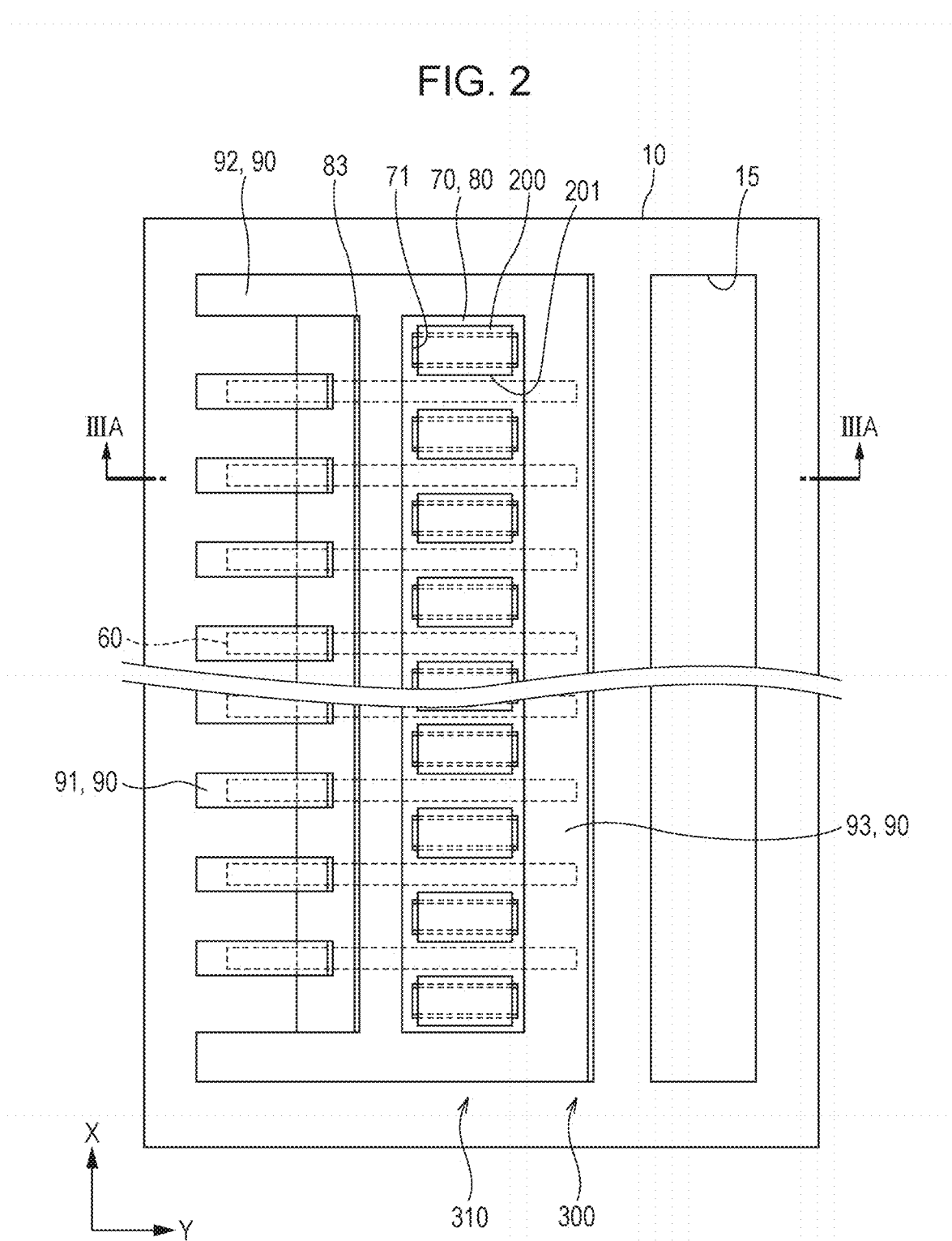
FIG. 2 is a plan view of a flow channel formation substrate of the recording head according to Embodiment 1 of the invention.
Figure 3A:
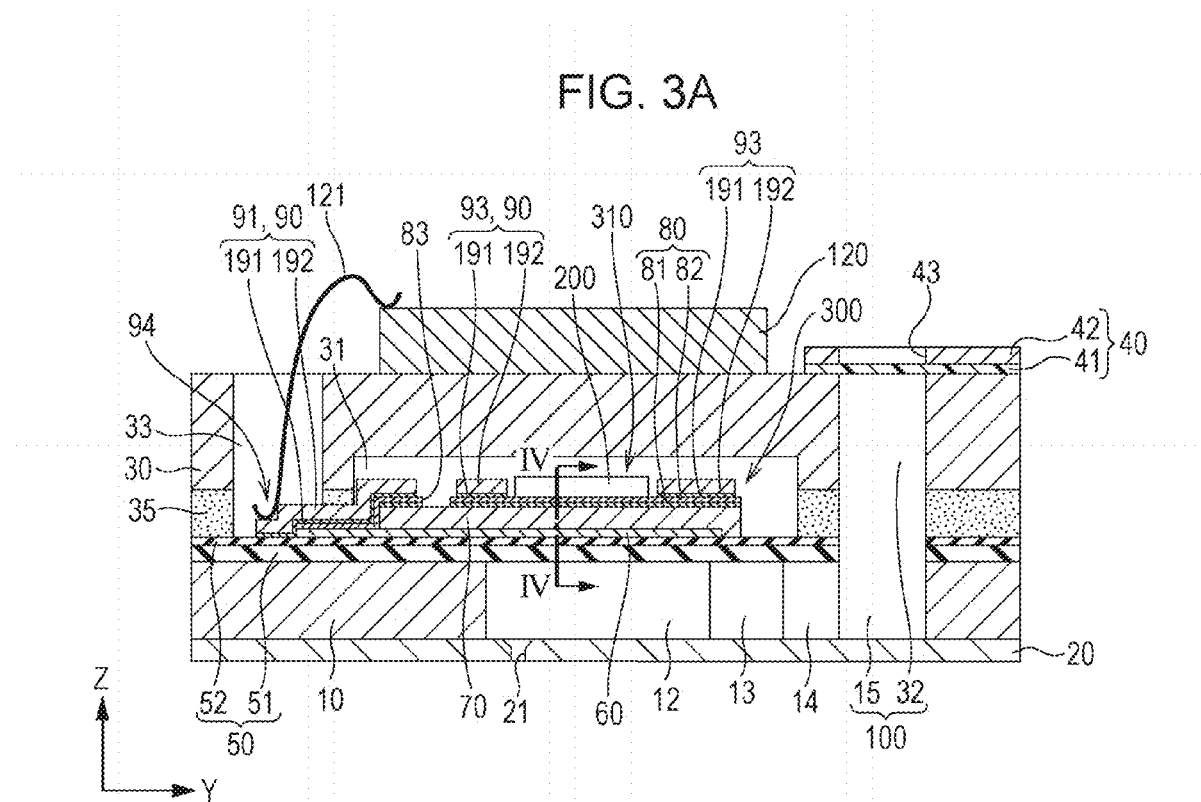
FIGS. 3A and 3B are a cross-sectional view and an expanded cross-sectional view of the recording head according to Embodiment 1 of the invention.
Figure 3B:
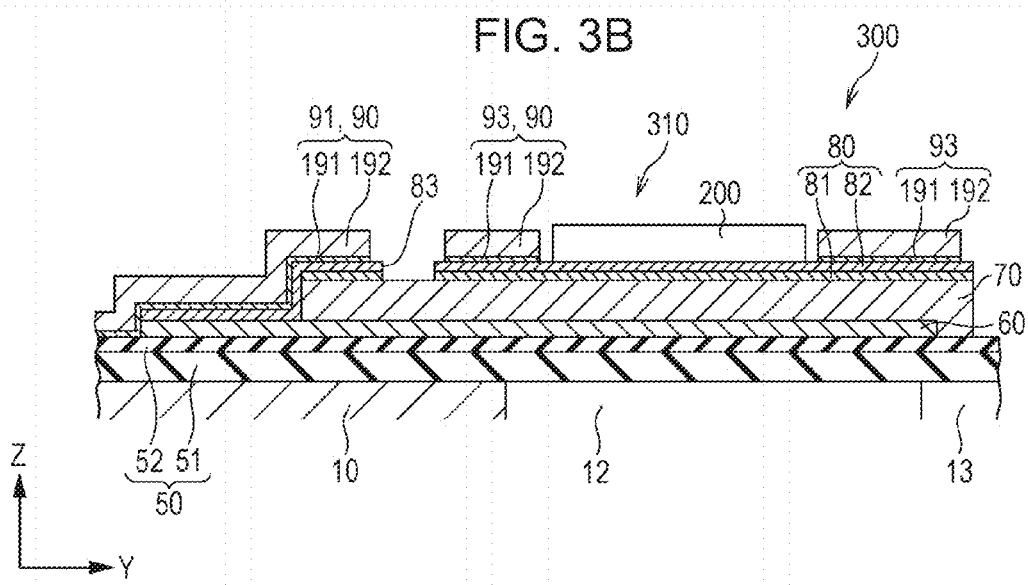
Figure 4:
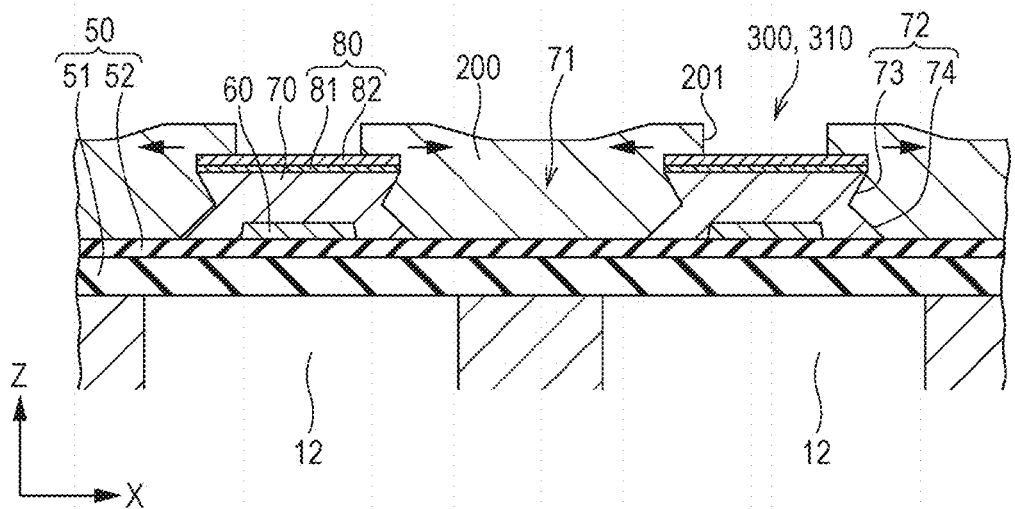
FIG. 4 is a cross-sectional view in which the main sections of the recording head according to Embodiment 1 of the invention have been expanded.

FIG. 1 is an exploded perspective view of an ink jet type recording head, which is an example of the liquid ejecting head according to Embodiment 1 of the invention, FIG. 2 is a plan view of a flow channel formation substrate of the ink jet type recording head, FIGS. 3A and 3B are a cross-sectional view and an expanded cross-sectional view that follow a IIIA-IIIA line in FIG. 2, and FIG. 4 is a cross-sectional view that follows a IV-IV line in FIG. 3A.

As illustrated in the drawings, pressure generation chambers 12 are formed as concave sections in a flow channel formation substrate 10, which is a substrate of the present embodiment, that an ink jet type recording head I, which is an example of the liquid ejecting head of the present embodiment, is provided with. Further, the pressure generation chambers 12, which are partitioned by a plurality of dividing walls 11, are arranged in parallel along a direction in which a plurality of nozzle openings 21, which discharge ink of the same color, are arranged in parallel. Hereinafter, this direction will be referred to as a parallel arrangement direction of the pressure generation chambers 12, or as a first direction X. In addition, a direction that is orthogonal to the first direction X will hereafter be referred to as a second direction Y. Furthermore, a direction that is orthogonal to the first direction X and the second direction Y will hereafter be referred to as a third direction Z.

In addition, ink supply channels 13 and communication channels 14 are partitioned on an end section side in a longitudinal direction of the pressure generation chambers 12 of the flow channel formation substrate 10, that is, on an end section side in the second direction Y that is orthogonal to the first direction X by the plurality of dividing walls 11. A communication section 15, which configures a portion of a manifold 100, which is an ink chamber (liquid chamber) that is common to each pressure generation chamber 12, is formed on an outer side of the communication channels 14 (a side that is opposite to the pressure generation chambers 12 in the second direction Y). That is, a liquid flow channel that is formed from the pressure generation chambers 12, the ink supply channels 13, the communication channels 14, and the communication section 15 is formed in the flow channel formation substrate 10.

A nozzle plate 20, into which the nozzle openings 21, which communicate with each pressure generation chamber 12, are drilled, is joined to a first surface side of the flow channel formation substrate 10, that is, a surface at which the liquid flow channel of the pressure generation chambers 12 and the like is open, using an adhesive, a heat welding film or the like. That is, the nozzle openings 21 are arranged in parallel on the nozzle plate 20 in the first direction X.

A vibration plate 50 is formed on a second surface side of the flow channel formation substrate 10. The vibration plate 50 is configured by an elastic film 51 that is formed on the flow channel formation substrate 10, and an insulating body film 52 that is formed on the elastic film 51. Additionally, the liquid flow channel of the pressure generation chambers 12 and the like is formed by anisotropic etching of the flow channel formation substrate 10 from a first surface, and a second surface of the liquid flow channel of the pressure generation chambers 12 and the like is configured by the vibration plate 50 (the elastic film 51).

A piezoelectric element 300, which is configured by, for example, a first electrode 60 with a thickness of approximately 0.2 µm, a piezoelectric body layer 70 with a thickness of approximately 1.0 µm, and a second electrode 80 with a thickness of approximately 0.05 µm, is formed on the insulating body film 52.

Figure 5:
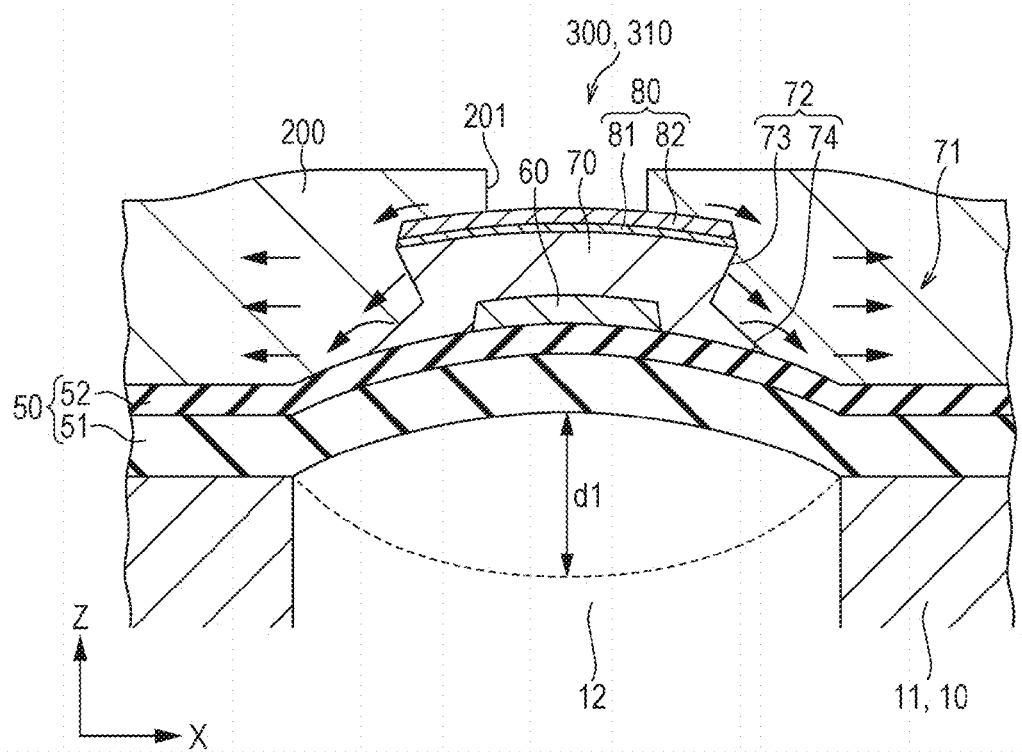
FIG. 5 is a cross-sectional view in which the main sections of the recording head according to Embodiment 1 of the invention have been expanded.
Figure 6A:
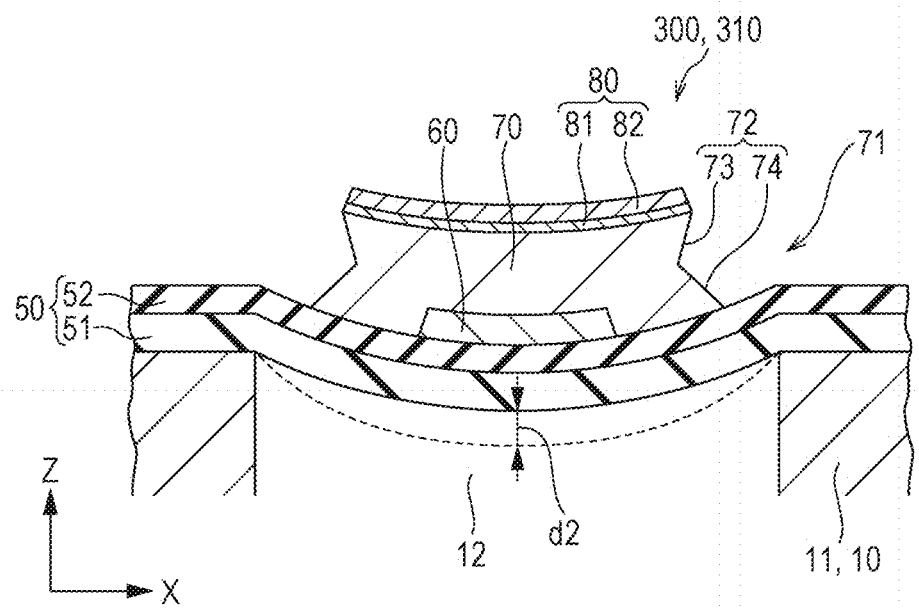
FIGS. 6A and 6B are cross-sectional views in which the main sections of a recording head according to a comparative example of the invention have been expanded.
Figure 6B:
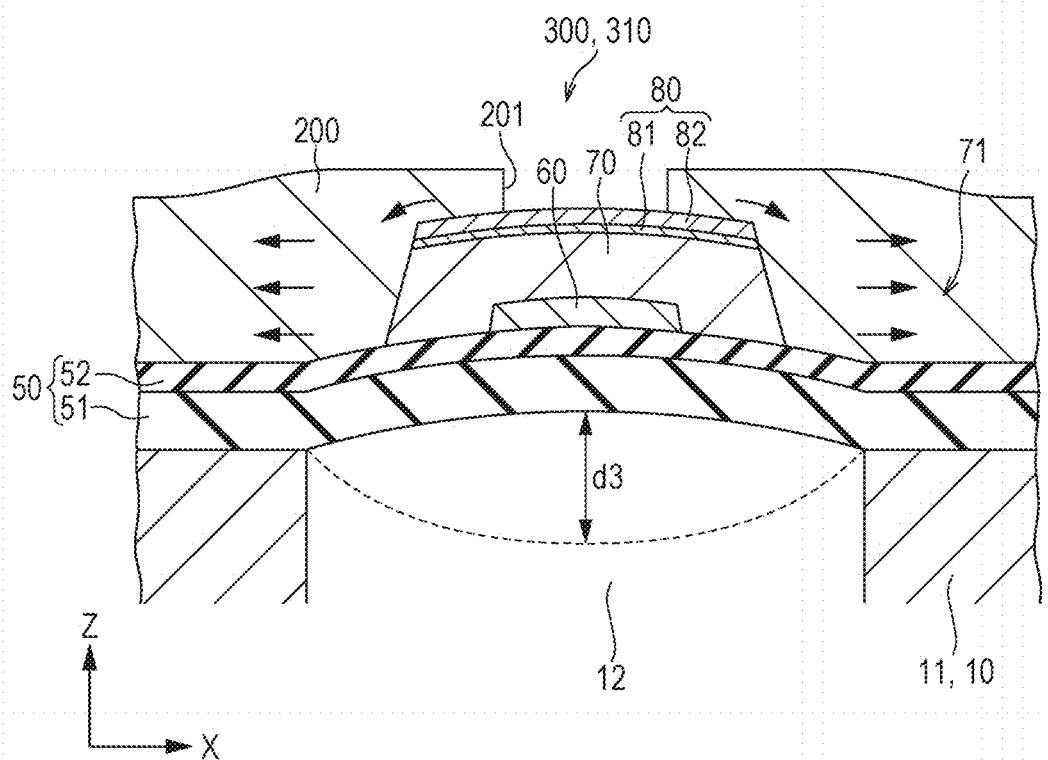

Hereinafter, the piezoelectric element 300 will be further described in detail with reference to FIGS. 3A to 7. Additionally, FIG. 5 is a cross-sectional view in which the main sections of the recording head according to Embodiment 1 of the invention have been expanded, and FIGS. 6A, 6B and 7 are cross-sectional views in which the main sections of a recording head according to a comparative example have been expanded.

As illustrated in the drawings, the first electrodes 60 that configures the piezoelectric element 300 of the present embodiment is cut and divided for each pressure generation chamber 12, and configures individual electrodes that are independent for each active section 310, which will be described later. The first electrodes 60 are formed with a width that is narrower than the widths of the pressure generation chambers 12 in the second direction Y of the pressure generation chambers 12. That is, end sections of the first electrodes 60 in the first direction X of the pressure generation chambers 12 are positioned on inner sides of regions that face the pressure generation chambers 12. In addition, both end sections of the first electrodes 60 in the second direction Y respectively extend up to outer sides of the pressure generation chamber 12. Additionally, the material of the first electrodes 60 is preferably a material that can retain conductivity without becoming oxidized during film formation of the piezoelectric body layer 70, which will be described later, and for example, a precious metal such as platinum (Pt) or iridium (Ir), or a conductive oxide that can be represented by lanthanum nickel oxide (LNO) is suitably used.

In addition, an adhesive layer for ensuring adhesive force may be used between the abovementioned conductive material, as the first electrodes 60, and the vibration plate 50. In the present embodiment, although not especially illustrated in the drawings, titanium is used as an adhesive layer. Additionally, as the adhesive layer, it is possible to use zirconium, titanium, titanium oxide or the like. That is, in the present embodiment, the first electrodes 60 are formed by an adhesive layer that is formed from titanium and a conductive layer of at least one material selected from the abovementioned conductive materials.

The piezoelectric body layer 70 is provided continuously along the first direction X so that the second direction Y becomes a predetermined width. The width of the piezoelectric body layer 70 in the second direction Y is greater than the length of the pressure generation chamber 12 in the second direction Y. Therefore, the piezoelectric body layer 70 is provided up to an outer side of the pressure generation chambers 12 in the second direction Y of the pressure generation chambers 12.

The end sections of an ink supply channel side of the piezoelectric body layer 70 in the second direction Y of the pressure generation chambers 12 are positioned further on an outer side than the end sections of the first electrodes 60. That is, the end sections of the first electrodes 60 are covered by the piezoelectric body layer 70. In addition, the end sections of a nozzle opening 21 side of the piezoelectric body layer 70 are positioned further on an inner side (a pressure generation chamber 12 side) than the end sections of the first electrodes 60, and the end sections of the nozzle opening 21 side of the first electrodes 60 are not covered by the piezoelectric body layer 70.

The piezoelectric body layer 70 is a perovskite structure crystalline film (a perovskite type crystal) that is formed from a ferroelectric ceramic amount that shows an electromechanical conversion effect, and is formed on the first electrodes 60. As the material of the piezoelectric body layer 70, for example, it is possible to use a such as lead zirconate titanate (PZT), a material in which a metal oxide such as niobium oxide, nickel oxide or magnesium oxide is added to the ferroelectric piezoelectric material or the like. In addition, the material of the piezoelectric body layer 70 is not limited to a lead-based material that includes lead, and it is possible to use a non-lead-based material that does not include lead.

Although this will be described in more detail later, the piezoelectric body layer 70 can be formed by a liquid phase method such as a sol-gel method or a metal-organic decomposition (MOD) method, or a physical vapor deposition (PVD) method (a gas phase method) such as a sputtering method or a laser ablation method.

First opening sections 71, which have a concave shape that is open on a side that is opposite to the flow channel formation substrate 10 to correspond to each dividing wall 11, are formed in this kind of piezoelectric body layer 70. The first opening sections 71 are provided penetrating the piezoelectric body layer 70 in the third direction Z, which is a thickness direction. The width of the first opening sections 71 in the first direction X is wider than the width of each dividing wall 11 in the first direction. As a result of this, since the rigidity of portions (so-called arm sections of the vibration plate 50) that face the end sections of the vibration plate 50 in the first direction X of the pressure generation chambers 12 is held down, it is possible to favorably displace the opposing substrate 30. That is, basically, the piezoelectric body layer 70 is not formed on the dividing walls 11. Incidentally, the piezoelectric body layer 70 may be formed on the dividing walls 11 at end sections of the dividing walls 11 in the second direction Y. In other words, the length of the first opening sections 71 in the second direction Y may be longer than the pressure generation chambers 12 and extend further on an outer side than the end sections of the pressure generation chambers 12, or may be shorter than the pressure generation chambers 12 and be provided further on an inner side than the end sections of the pressure generation chambers 12.

In addition, the groove sections 72 are provided on side surfaces of the piezoelectric body layer 70, which are exposed by the first opening sections 71. The groove sections 72 in the present embodiment are provided with first surfaces 73, which relatively face a surface of the vibration plate 50 in the third direction Z, and second surfaces 74, which are provided toward a second electrode 80 side in the third direction Z. In this instance, the first surfaces 73 being provided relatively facing a surface of the vibration plate 50 refers to the first surfaces 73 being provided toward a vibration plate 50 side in the third direction Z and being in positions that relatively face a surface of the vibration plate 50, and a portion of the piezoelectric body layer 70, the first electrodes 60 or the like may be provided between the first surfaces 73 and the vibration plate 50. That is, it is suitable as long as a surface direction of the first surfaces 73 is a direction that includes at least one component in the first direction X and in the second direction Y. In addition, since it is suitable as long as the second surfaces 74 are provided toward the second electrode 80 side, the second surfaces 74 need not be disposed relatively facing the second electrode 80. That is, the second surface 74 and the second electrode need not be disposed in positions that overlap when viewed in plan view from the third direction Z. In other words, it is suitable as long as the surface direction of the second surfaces 74 is a direction that includes at least one component in the first direction X and in the second direction Y.

In addition, in the present embodiment, the first surfaces 73 and the second surfaces 74 are provided inclined with respect to both the third direction Z and the surface directions that include the first direction X and the second direction Y. That is, the groove sections 72 are formed by cutting out a V-shape (a cross-section of which is triangular) from the side surfaces of the piezoelectric body layer 70. Additionally, although this will be described in more detail later, such groove sections 72 can be easily formed by performing wet etching of the piezoelectric body layer 70.

The second electrode 80 is provided on a surface side of the piezoelectric body layer 70 that is opposite to the first electrodes 60, and configures a common electrode that is common to a plurality of active sections 310. In the present embodiment, the second electrode 80 is provided with a first layer 81, which is provided on a piezoelectric body layer 70 side, and a second layer 82, which is provided on a side that is opposite to the piezoelectric body layer 70 of the first layer 81.

It is desirable that the first layer 81 is a material that can favorably form an interface with the piezoelectric body layer 70, and can exhibit an insulation property and piezoelectric characteristics, and a precious metal material such as iridium (Ir), platinum (Pt), palladium (Pd), or gold (Au), or a conductive oxide that can be represented by lanthanum nickel oxide (LNO) is suitably used. In addition, the first layer 81 may be a lamination of a plurality of materials. In the present embodiment, a laminated electrode of iridium (Ir) and titanium (Ti) (in which the iridium is in contact with the piezoelectric body layer 70) is used. Further, the first layer 81 can be formed by a physical vapor deposition (PVD) method (a gas phase method) such as a sputtering method or a laser ablation method, or a liquid phase method such as a sol-gel method, a metal-organic decomposition (MOD) method, or a plating method. In addition, after the formation of the first layer 81, it is possible to perform characteristic improvement of the piezoelectric body layer 70 by performing a heat treatment. Such a first layer 81 is formed on the piezoelectric body layer 70 only, that is, on a surface of the piezoelectric body layer 70 on a side that is opposite to the flow channel formation substrate 10.

In addition, the second layer 82 that configures the second electrode 80 can use a conductive material, and for example, can use a metal material such as iridium (Ir), platinum (Pt), palladium (Pd), or gold (Au). Naturally, the second layer 82 may be a simple material of one of the abovementioned metal materials, and may be a complex material in which a plurality of materials are mixed. In addition, titanium or the like may be provided between the first layer 81 and the second layer 82. In the present embodiment, a laminated electrode of iridium (Ir) and titanium (Ti) is used as the second layer 82.

In the present embodiment, such a second layer 82 is formed on the first layer 81. In addition, the second layer 82 is drawn out onto the first electrodes 60 from the side surfaces of the piezoelectric body layer 70 in the second direction Y. Additionally, the second layer 82 is formed to be thicker than the first layer 81 in order to lower electric resistance. Further, since internal stress (residual stress) becomes compressive stress in iridium, and internal stress is substantially 0 (zero) in titanium, internal stress becomes compressive stress in the second electrode 80 of the present embodiment. Naturally, the internal stress (the residual stress) of the second electrode 80 may be set to be tensile stress by changing the material or the manufacturing method of the second electrode 80. As will be described in more detail later, it is possible to achieve an improvement in the displacement amount of the active section 310 by setting the second electrode 80 to have compressive stress. In other words, in a case in which a plurality of the second electrodes 80 are laminated, even if a portion of the layers thereof are tensile stress, the internal stress of the second electrode 80 is compressive stress as long as the second electrode 80 is compressive stress overall. Incidentally, the second layer 82 on the first layer 81 and the second layer 82 on the first electrodes 60 are electrically cut by a removal section 83. That is, the second layer 82 on the first layer 81 and the second layer 82 on the first electrodes 60 are formed from the same layer, but are formed so as to be electrically discontinuous. In this instance, the removal section 83 is provided on the piezoelectric body layer 70 on the nozzle opening 21 side, and electrically cuts the second electrode 80 by penetrating the second electrode 80, that is, the first layer 81 and the second layer 82, in the thickness direction (a lamination direction of the first layer 81 and the second layer 82). Such a removal section 83 is provided penetrating the second electrode 80 in the thickness direction continuously throughout the first direction X.

Additionally, in the present embodiment, the second layer 82 of the second electrode 80 is not provided on the side surfaces of the piezoelectric body layer 70, that is, inside the groove sections 72, which are the side surfaces of the first opening section 71, but the configuration is not particularly limited to this, and the second layer 82 may be continuously provided from the top of the first layer 81 throughout the inside of the groove sections 72.

Displacement occurs in the piezoelectric element 300 that is configured by this kind of first electrode 60, piezoelectric body layer 70, and second electrode 80 as a result of a voltage being applied between the first electrode 60 and the second electrode 80. That is, piezoelectric distortion occurs in the piezoelectric body layer 70, which is interposed between the first electrode 60 and the second electrode 80 as a result of a voltage being applied between the two electrodes. Further, when a voltage is applied between the two electrodes, a portion in which the piezoelectric distortion occurs in the piezoelectric body layer 70 is referred to as an active section 310. In contrast to this, a portion in which the piezoelectric distortion does not occur in the piezoelectric body layer 70 is referred to as a non-active section. In addition, in the active section 310 in which the piezoelectric distortion occurs in the piezoelectric body layer 70, a portion that faces the pressure generation chamber 12 is referred to as a flexible section, and a portion that is on the outer side of the pressure generation chamber 12 is referred to as a non-flexible section.

In the present embodiment, the entirety of the first electrode 60, the piezoelectric body layer 70 and the second electrode 80 are provided continuously in the second direction Y up to the outer side of the pressure generation chamber 12. That is, the active section 310 is provided continuously up to the outer side of the pressure generation chamber 12. Therefore, among the active section 310, a portion that faces the pressure generation chamber 12 of the piezoelectric element 300 is the flexible section, and a portion that is on the outer side of the pressure generation chamber 12 is the non-flexible section.

That is, in the present embodiment, as shown in FIGS. 3A and 3B, the end sections of the active section 310 in the second direction Y are defined by the second electrode 80 (the removal section 83).

In addition, the end sections of the active section 310 in the first direction X are defined by the first electrode 60. Further, the end sections of the first electrode 60 in the first direction X are provided within a region that relatively faces the pressure generation chamber 12. Therefore, the end sections of the active section 310 in the first direction X are flexibly provided, and stress at the boundary between the active section 310 and the non-active section is released as a result of deformation of the vibration plate in the first direction X. Therefore, it is possible to suppress breakage such as burnout or cracking that is caused by the convergence of stress at end sections of the active section 310 in the first direction X.

In such a piezoelectric element 300, since the second electrode 80 covers the piezoelectric body layer 70, a current does not leak between the first electrode 60 and the second electrode 80, and therefore, it is possible to suppress breakage of the piezoelectric element 300. Incidentally, if the first electrode 60 and the second electrode 80 are exposed in an adjacent state, a current leaks at the surface of the piezoelectric body layer 70, and the piezoelectric body layer 70 breaks. In addition, even if the first electrode 60 and the second electrode 80 are exposed, if a distance therebetween is not close, the leakage of current does not occur.

In addition, as shown in FIG. 4, a stress application film 200 is provided in such a piezoelectric element 300.

The stress application film 200 is provided so as to come into contact with the groove sections 72 that are provided on the side surfaces of the piezoelectric element 300. In the present embodiment, the stress application film 200 is provided so as to fill the inside of the first opening section 71. In addition, the stress application film 200 extends up to the upper surface of the piezoelectric element 300, that is, onto a surface on a side that is opposite to the flow channel formation substrate 10 in the third direction Z, and second opening sections 201, which are opening sections, are provided in regions that correspond to central sections of the second electrode 80 of the active section 310. That is, the second opening sections 201 are provided in regions that correspond to central sections of the upper surface of the piezoelectric element 300 for each active section 310, and in the present embodiment, the second electrode 80 is exposed by the second opening sections 201.

Further, such a stress application film 200 is respectively provided on both sides of each active section 310 in the first direction X, and is provided continuously in the first opening section 71 between two active sections 310 that are mutually adjacent in the first direction X. Naturally, the stress application film 200 is not limited to this configuration, and a configuration in which a stress application film 200 that is respectively provided on both sides of each active section 310 in the first direction X, and provided between active sections 310 that are mutually adjacent in the first direction X, is provided independently rather than being continuous on the dividing walls 11, is also possible. In addition, the stress application film 200 that is provided on both sides of each active section 310 in the first direction X may be provided either continuously or separated on the outer side of the active sections 310 in the second direction Y. The reason for this is that the piezoelectric element 300 on both sides of the first opening section 71 in the second direction Y is a portion that does not contribute to the deformation of the active section 310.

This kind of stress application film 200 is a substance in which internal stress (residual stress) includes tensile stress, and which applies tensile stress to the piezoelectric element 300. This kind of stress application film 200 may be an insulating material, and may be an inorganic material or an organic material. In addition, since the stress application film 200 is provided in regions that cover the side surfaces of the piezoelectric element 300 and face the pressure generation chambers 12 of the vibration plate 50, it is preferable to use a material in which the comparative Young's modulus is low. As a result of this, it is possible to suppress a circumstance in which the stress application film 200 inhibits deformation of the piezoelectric element 300 and the vibration plate 50, and the displacement amount decreases as a result. In this manner, as a material in which the Young's modulus is low, it is preferable to use an organic material. In addition, it is preferable that the stress application film 200 uses a material that does not have an influence on other layers, for example, the vibration plate 50 and the second electrode 80, when film formation and patterning of the stress application film 200 is performed, and for example, it is possible to suitably use a photosensitive resin such as a polyimide. In this manner, as a result of using a photosensitive resin as the stress application film 200, patterning using dry etching or the like is not necessary, and therefore, it is possible to suppress a circumstance in which a portion of the vibration plate 50, the piezoelectric element 300 or the like is removed as a result of over-etching due to dry etching. Additionally, the stress application film 200 may be configured by laminating a plurality of layers. As a result of this, it is possible to easily form a comparatively thick stress application film 200. Incidentally, even if internal stress of a portion of the layers that configure the stress application film 200 is compressive stress, it is suitable as long as the internal stress is tensile stress overall.

Furthermore, it is preferable that the stress application film 200 is set to be higher than the height from the vibration plate 50 of the piezoelectric element 300 in the third direction Z. That is, it is preferable that the thickness of the stress application film 200 in the third direction Z is formed to be thicker than the thickness of the piezoelectric element 300 in the third direction Z. As a result of this, it is possible to reliably provide the stress application film 200 up to the upper surface of the piezoelectric element 300, that is, onto a surface on a side that is opposite to the flow channel formation substrate 10 in the third direction Z. In addition, it is possible to improve the raising effect of the piezoelectric element 300. In the present embodiment, as the stress application film 200, a photosensitive polyimide is used, and the stress application film 200 is formed to be thicker than the thickness of the piezoelectric element 300 in the third direction Z.

However, it is preferable that the thickness of the stress application film 200 from the vibration plate 50, and in particular, the thickness on the vibration plate 50 at the flexible sections, that is, the thickness inside the first opening section 71 is greater than or equal to 100% and less than or equal to 200% with respect to the thickness of the piezoelectric element 300 from the vibration plate 50. By setting the thickness of the stress application film 200 to be greater than or equal to 100% with respect to the thickness of the piezoelectric element 300 from the vibration plate 50, it is possible to improve the raising effect of the piezoelectric element 300. In addition, by setting the thickness of the stress application film 200 to be less than or equal to 200% with respect to the thickness of the piezoelectric element 300 from the vibration plate 50, a rate of deterioration in the displacement amount when the piezoelectric element 300 is repeatedly driven is decreased, and therefore, it is possible to perform stable deformation. That is, the raising effect of the piezoelectric element 300 is low if the stress application film 200 is too thin, and the stress application film 200 inhibits the displacement of the vibration plate 50 and the displacement amount when the piezoelectric element 300 is repeatedly driven deteriorates if the stress application film 200 is too thick.

As a result of providing such a stress application film 200, stress that raises the piezoelectric element 300 toward a side that is opposite to the pressure generation chamber 12 in the third direction Z is applied. In other words, as shown in FIG. 5, since the vibration plate 50 and the piezoelectric element 300 are warped to the piezoelectric element 300 side in a state in which an electric field is not applied, an amount of protrusion of the flow channel formation substrate 10 toward the inside of the pressure generation chamber 12 is reduced. In the present embodiment, in a state in which an electric field is not applied, the piezoelectric element 300 is retained in a deformed state in a manner that is convex on a side that is opposite to the flow channel formation substrate 10. In particular, in the present embodiment, since a stress moment in which the first direction X and a direction that runs toward the flow channel formation substrate 10 in the third direction Z are combined, is applied to the first surfaces 73 as a result of the stress application film 200 pulling the first surfaces 73 tight in the first direction X, it is possible to improve the raising effect of the piezoelectric element 300. In addition, since the stress application film 200 is provided up to the upper surface of the piezoelectric element 300, the piezoelectric element 300 is pulled tight in the first direction X at the upper surface of the piezoelectric element 300, and therefore, it is possible to make the stress moment that raises in the third direction Z larger, and it is possible to improve the raising effect of the piezoelectric element 300. In this manner, since it is possible to deform the piezoelectric element 300 in a manner that is greatly convex on a side that is opposite to the flow channel formation substrate 10 in a state in which an electric field is not applied to the piezoelectric element 300, it is possible to make a displacement amount d1 larger by applying an electric field to the piezoelectric element 300 and deforming the piezoelectric element 300 in manner that is convex inside the pressure generation chamber 12. In addition, in the present embodiment, since the stress application film 200 is directly provided on inner surfaces of the groove sections 72 in a manner that comes into contact therewith, the side surfaces of the piezoelectric body layer 70 are protected by the stress application film 200. In particular, in a case in which a plurality of groove sections 72 are provided, as a result of providing the stress application film 200, it is possible to suppress a circumstance in which tip ends, which protrude between adjacent groove sections 72, or the like become chipped.

In contrast to this, for example, as shown in FIG. 6A, in a case in which the groove sections 72 are provided in the piezoelectric body layer 70 but the stress application film 200 is not provided, in a state in which an electric field is not applied, the piezoelectric element 300 deforms in a manner that is greatly convex toward the inner side of the pressure generation chamber 12 of the flow channel formation substrate 10. Therefore, if an electric field is applied to the piezoelectric element 300 and the piezoelectric element 300 is displaced in a manner that is convex inside the pressure generation chamber 12, the displacement amount d2 is smaller than the displacement amount d1.

In addition, for example, as shown in FIG. 6B, in a case in which a stress application film 200, which is provided with the second opening sections 201, is provided without providing the groove sections 72 in the piezoelectric body layer 70, since there is no stress moment that pulls the first surfaces 73 tight toward the flow channel formation substrate 10, the raising effect of the piezoelectric element 300 due to the stress application film 200 is low, and in a state in which an electric field is not applied, the deformation amount with which the piezoelectric element 300 protrudes in a convex shape on a side that is opposite to the flow channel formation substrate 10 is small. Therefore, a displacement amount d3 when an electric field is applied to the piezoelectric element 300 is smaller than the displacement amount d1.

Furthermore, for example, as shown in FIG. 7, in a case in which the groove sections 72 are provided in the piezoelectric body layer 70, and a stress application film 200, which is not provided with the second opening sections 201, is provided, since the second opening sections 201 are not formed, the raising effect of the piezoelectric element 300 due to the stress application film 200 is low, and in a state in which an electric field is not applied, the deformation amount with which the piezoelectric element 300 protrudes in a convex shape on a side that is opposite to the flow channel formation substrate 10 is small. Therefore, a displacement amount d4 when an electric field is applied to the piezoelectric element 300 is smaller than the displacement amount d1. In addition, as shown in FIG. 7, since the deformation of the piezoelectric element 300 is inhibited by the stress application film 200 as a result of not providing the upper surface of the piezoelectric element 300, that is, the second opening sections 201, which expose the main sections of the second electrode 80, the amount of protrusion toward the inside of the pressure generation chamber 12 when an electric field is applied to the piezoelectric element 300 also falls. However, since the displacement amount d4 is higher than the displacement amount d2, the configuration that is shown in FIG. 7 may also be used.

In this manner, as shown in FIG. 5, by providing the groove sections 72, which include the first surfaces 73, on the side surfaces of the piezoelectric body layer 70, and providing the stress application film 200, which include the second opening sections 201, and in which internal stress is tensile stress, it is possible to obtain a large displacement amount at low voltages. Therefore, it is possible to configure a so-called high displacement efficiency piezoelectric element 300. Additionally, in the present embodiment, the piezoelectric element 300 can deform in a manner that is convex on a side that is opposite to the pressure generation chamber 12 as a result of providing the groove sections 72 and the stress application film 200, but a case in which the amount of protrusion with which the piezoelectric element 300 is deformed in a concave shape inside the pressure generation chamber 12 becomes smaller as a result of the film thicknesses and materials of the vibration plate 50, the piezoelectric element 300 and the stress application film 200 although the piezoelectric element 300 deforms in a manner that is convex inside the pressure generation chamber 12 is also possible.

In addition, in the present embodiment, in addition to providing the groove sections 72 on the side surfaces of the piezoelectric body layer 70, and providing the stress application film 200, by providing the second electrode 80 in which internal stress becomes compressive stress, stress that raises the piezoelectric element 300 to a side that is opposite to the pressure generation chamber 12 is applied, and it is possible to further configure a high displacement efficiency piezoelectric element 300.

As shown in FIGS. 3A to 4, an individual lead electrode 91, which is a wiring layer of the present embodiment, and a common lead electrode 92 are connected to the first electrode 60 and the second electrode 80 of the piezoelectric element 300.

In the present embodiment, the individual lead electrode 91 and the common lead electrode 92 (hereinafter, collectively referred to as a lead electrode 90) are formed from the same layer, but are formed so as to not be electrically discontinuous. More specifically, the lead electrode 90 is provided with an adhesive layer 191, which is provided on an electrode (the second layer 82 of the second electrode 80) side, and a conductive layer 192, which is provided on the adhesive layer 191.

The adhesive layer 191 is a layer for improving adhesiveness between the second layer 82, the vibration plate 50 and the like and the conductive layer 192, and as the material thereof, it is possible to use nickel (Ni), chromium (Cr), nickel chromium (NiCr), titanium (Ti), titanium tungsten (TiW) or the like. Naturally, the adhesive layer 191 may also be a component that uses a simple material of the above-mentioned substances, may be a complex material in which a plurality thereof are mixed, or may be a component in which a plurality of layers of different materials are laminated. In the present embodiment, nickel chromium (NiCr) is used as the adhesive layer 191.

In addition, the conductive layer 192 is not limited as long as it is a material with comparatively high conductivity, and for example, can use gold (Au), platinum (Pt), aluminum (Al), copper (Cu) or the like. In the present embodiment, gold (Au) is used as the conductive layer 192.

In this instance, the individual lead electrode 91 is provided on the first electrode 60 that is provided on the outer side of the piezoelectric body layer 70. Incidentally, although is formed from the same layer as the second layer 82 of the second electrode 80, an electrode layer that is discontinuous with the second layer 82 is provided on the first electrode 60. Therefore, the first electrode 60 and the individual lead electrode 91 are electrically connected through the electrode layer that is the same layer as the second layer 82 and is discontinuous with the second layer 82.

The common lead electrode 92 is provided on the second electrode 80 (on the second electrode 80 of the piezoelectric body layer 70). As shown in FIGS. 1 and 2, this kind of common lead electrode 92 is drawn out on the vibration plate 50 continuously in the second direction Y to both end sections of the flow channel formation substrate 10 in the first direction X.

In addition, the common lead electrode 92 includes an extended section 93, which is provided across wall surfaces of the pressure generation chambers 12 in the second direction Y, that is, boundaries between the flexible sections and the non-flexible sections. The extended section 93 is provided continuously throughout a plurality of active sections 310 in the first direction X, and is continuous with the common lead electrode 92 at both end sections in the first direction X. That is, the common lead electrode 92, which includes the extended section 93, is disposed continuously in a manner that surrounds the periphery of the active sections 310 when viewed in plan view from a protective substrate 30 side. In this manner, by providing the extended section 93, it is possible to suppress breakage of the piezoelectric body layer 70 in the convergence of stress at boundaries between the flexible sections and the non-flexible sections. In addition, since the common lead electrode 92 is effectively not formed on the flexible sections, it is possible to suppress decreases in the displacement of the active sections 310.

As shown in FIGS. 3A and 3B, a protective substrate that protects the piezoelectric element 300 is joined onto the flow channel formation substrate 10, on which this kind of piezoelectric element 300 is formed, using an adhesive 35. A piezoelectric element retention portion 31, which is a concave section that defines a space in which the piezoelectric element 300 is accommodated, is provided in the protective substrate 30. In addition, a manifold portion 32 that configures a portion of a manifold 100 is provided in the protective substrate 30. The manifold portion 32 is formed throughout the entirety of a width direction of the pressure generation chambers 12 penetrating the protective substrate 30 in a thickness direction, and in the abovementioned manner, is continuous with the communication section 15 of the flow channel formation substrate 10. In addition, a through hole 33, which penetrates the protective substrate 30 in the thickness direction, is provided in the protective substrate 30. The lead electrode 90 that is connected to the first electrode 60 of each active section 310 is exposed inside the through hole 33, and an end of connection wiring that is connected to a driving circuit, which is not illustrated, is connected to the lead electrode 90 inside the through hole 33.

A compliance substrate 40 that is formed from a sealing film 41 and a fixing plate 42 is joined onto the protective substrate 30. The sealing film 41 is formed from a flexible material with low rigidity, and a surface of the manifold portion 32 is sealed using the sealing film 41. In addition, the fixing plate 42 is formed with a hard material such as a metal. Since a region of the fixing plate 42 that faces the manifold 100 forms an open portion 43 in which the fixing plate 42 has been completely removed in the thickness direction, a surface of the manifold 100 is sealed by the flexible sealing film 41.

In such an ink jet type recording head I of the present embodiment, ink is taken in from an ink introduction port, which is connected to an external ink supply unit, which is not illustrated, an inner section from the manifold 100 to the nozzle openings 21 is filled with ink, and a voltage is subsequently respectively applied between the first electrode 60 and the second electrode 80 to correspond to the pressure generation chambers 12 according to a recording signal from the driving circuit. As a result of this, the piezoelectric element 300 and the vibration plate 50 are deformed in a deflection manner, pressure inside the pressure generation chambers 12 is increased, and ink droplets are ejected from each nozzle opening 21.

In this instance, a manufacturing method of this kind of ink jet type recording head of the present embodiment will be described. Additionally, FIGS. 8A to 13C are cross-sectional views that show the manufacturing method of the ink jet type recording head.

Figure 8A:
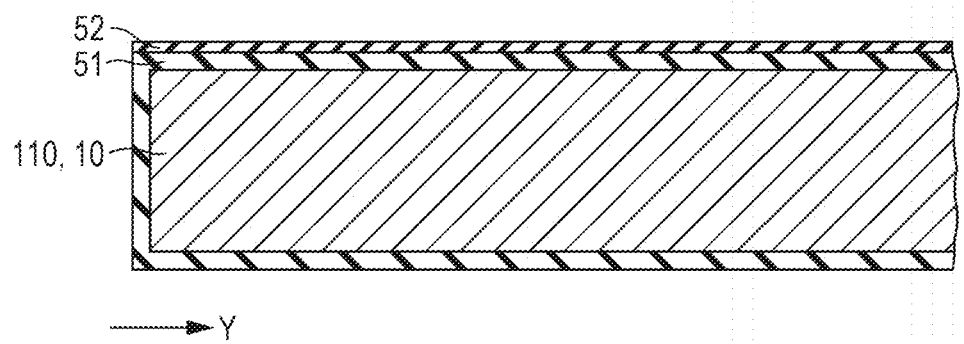
FIGS. 8A and 8B are cross-sectional views that show a manufacturing method of a recording head according to Embodiment 1 of the invention.

Firstly, as shown in FIG. 8A, the vibration plate is formed on the surface of a flow path formation substrate wafer 110, which is a silicon wafer on which a plurality of flow channel formation substrates 10 are formed integrally. In the present embodiment, a vibration plate 50 that is formed from a lamination of silicon dioxide (the elastic film 51), which is formed through thermal oxidation of the flow path formation substrate wafer 110, and zirconium oxide (the insulating body film 52), which is formed through thermal oxidation after film formation using a sputtering method, is formed.

Figure 8B:
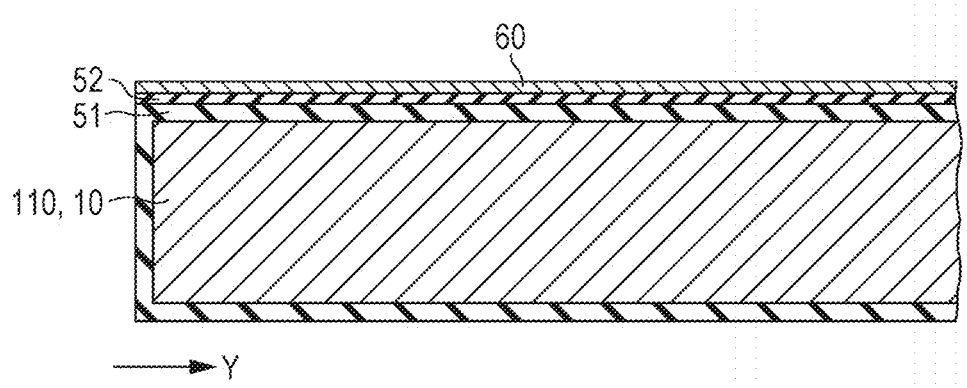

Next, as shown in FIG. 8B, the first electrode 60 is formed over the entire surface of the insulating body film 52. The material of the first electrode 60 is not particularly limited, but for example, a metal such as platinum or iridium that does not lose conductivity even in a high temperature oxidation treatment, or a conductive oxide such as iridium oxide or lanthanum nickel oxide, or a laminated material of these materials is suitably used. In addition, the first electrode 60 can be formed using a sputtering method or a physical vapor deposition method (a PVD method), gas phase film formation such as a laser ablation method, liquid phase film formation such as a spin coating method or the like. In addition, an adhesive layer for ensuring adhesive force may be used between the abovementioned conductive material and the vibration plate 50. In the present embodiment, although not specifically illustrated in the drawings, titanium is used as the adhesive layer. Additionally, as the adhesive layer, it is possible to use zirconium, titanium, titanium oxide or the like. In addition, a control layer for controlling crystal growth of the piezoelectric body layer 70 on an electrode surface (a film formation side of the piezoelectric body layer 70), may be formed. In the present embodiment, titanium is used as crystal control of the piezoelectric body layer 70 (PZT). Since the titanium is taken inside the piezoelectric body layer 70 during film formation of the piezoelectric body layer 70, the titanium is not present as a film after film formation of the piezoelectric body layer 70. As a crystal control layer, a conductive oxide or the like with a perovskite type crystal structure such as lanthanum nickel oxide may be used.

Next, in the present embodiment, the piezoelectric body layer 70 that is formed from lead zirconate titanate (PZT) is formed. In this instance, in the present embodiment, the piezoelectric body layer 70 is formed using a so-called sol-gel method that obtains a piezoelectric body layer 70 that is formed from a metal oxide by gelatinization through coating and drying a so-called sol in which metal complexes have been dissolved or dispersed in a solvent, and further firing the sol at a high temperature. Additionally, the manufacturing method of the piezoelectric body layer 70 is not limited to a sol-gel method, and for example, may use a physical vapor deposition (PVD) method such as a metal-organic decomposition (MOD) method, a sputtering method or a laser ablation method. That is, the piezoelectric body layer 70 may be formed using either a liquid phase method or a gas phase method. In the present embodiment, the piezoelectric body layer 70 is formed by laminating a plurality of layers of a piezoelectric body film 170.

More specifically, as shown in FIG. 9A, the first electrode 60 and the first layer of the piezoelectric body film 170 are simultaneously patterned so that the side surfaces thereof are inclined using a step in which the first layer of the piezoelectric body film 170 is formed on the first electrode 60. Additionally, the patterning of the first electrode 60 and the first layer of the piezoelectric body film 170 can, for example, be performed through dry etching such as reactive ion etching (RIE), ion milling or the like.

In this instance, for example, in a case in which the first layer of the piezoelectric body film 170 is formed after patterning the first electrode 60, since the first electrode 60 is patterned by a photo process, ion milling or icing, the surface of the first electrode 60 and a crystal seed layer such as titanium that is provided on the surface but is not illustrated, is disposed transformed. If this occurs, even if the piezoelectric body film 170 is formed on the transformed surface, the crystallinity of the piezoelectric body film 170 is not favorable, and therefore, since crystal growth is performed a second layer and above of the piezoelectric body film 170 with an influence on the crystalline state of the first layer of the piezoelectric body film 170, it is not possible to form a piezoelectric body layer 70 that has favorable crystallinity.

In comparison to this, if the first layer of the piezoelectric body film 170 is patterned simultaneously with the first electrode 60 after forming the first layer of the piezoelectric body film 170, the first layer of the piezoelectric body film 170 has strong properties as a seed for favorably performing crystal growth of the second layer and above of the piezoelectric body film 170 in comparison with a crystal seed such as titanium, and even if an extremely thin transformed layer is formed on a surface layer by patterning, this does not have a large influence on the crystal growth of the second layer and above of the piezoelectric body film 170.

Additionally, when the second layer and above of the piezoelectric body film 170 are formed on the vibration plate 50 (the insulating body film 52, which is zirconium oxide in the present embodiment) which is exposed prior to formation of the second layer of the piezoelectric body film 170, a crystal control layer (an intermediate crystal control layer) may be used. In the present embodiment, titanium is used as the intermediate crystal control layer. The intermediate crystal control layer that is formed from titanium is taken into the piezoelectric body film 170 during film formation of the piezoelectric body film 170 in the same manner as the titanium of the crystal control layer that is formed on the first electrode 60. Incidentally, in a case in which the intermediate crystal control layer is an intermediate electrode or a dielectric body of a capacitor that is connected in series, deteriorations in piezoelectric characteristics is brought about. Therefore, it is desirable that the intermediate crystal control layer is taken into the piezoelectric body film 170 (the piezoelectric body layer 70) and does not remain as a film after film formation of the piezoelectric body layer 70.

Next, as shown in FIG. 9B, the piezoelectric body layer 70 that is formed from the plurality of piezoelectric body films 170 is formed by laminating the second layer and above of the piezoelectric body film 170.

Incidentally, the second layer and above of the piezoelectric body film 170 are formed continuously throughout the insulating body film 52, on the side surfaces of the first electrode 60 and the first layer of the piezoelectric body film 170, and on the first layer of the piezoelectric body film 170. In addition, the groove sections 72 are considered to be formed at the interfaces that are formed by firing of the second layer and above of the piezoelectric body film 170 during patterning of the piezoelectric body layer 70 in later steps.

Figure 10A:
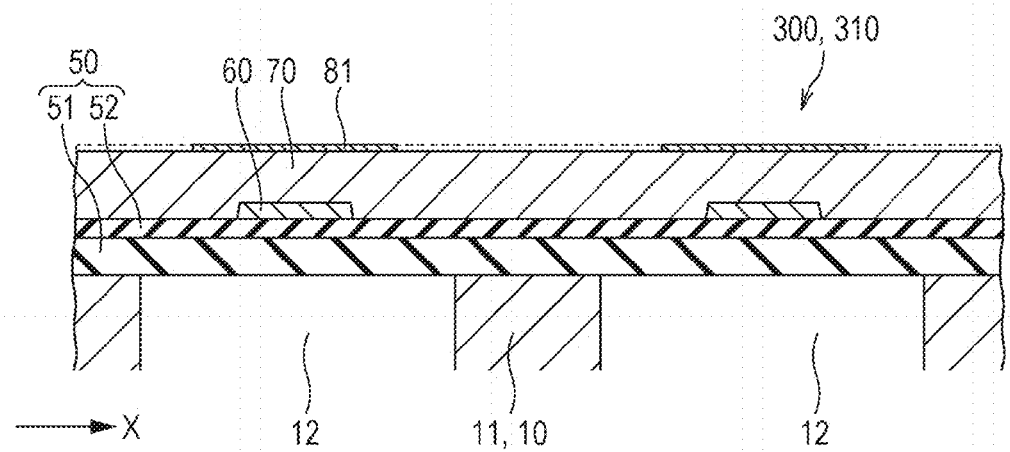
FIGS. 10A and 10B are cross-sectional views that show a manufacturing method of a recording head according to Embodiment 1 of the invention.

Next, as shown in FIG. 10A, the first layer 81, which configures the second electrode 80 is formed on the piezoelectric body layer 70 and patterned in a predetermined shape. In the present embodiment, although not specifically illustrated in the drawings, firstly, an iridium layer, which includes iridium, and a titanium layer, which is includes titanium, are respectively laminated on the piezoelectric body layer 70 and the iridium layer. Additionally, the iridium layer and the titanium layer can be formed using a sputtering method, a CVD method or the like. Thereafter, a reheating treatment (post-annealing) is further carried out on the piezoelectric body layer 70 on which the iridium layer and the titanium layer are formed. As a result of carrying out the reheating treatment in this manner, even if damage is generated when the iridium layer or the like is formed on the second electrode 80 side of the piezoelectric body layer 70, the damage to the piezoelectric body layer 70 is repaired by performing the reheating treatment, and therefore, it is possible to improve the piezoelectric characteristics of the piezoelectric body layer 70. In addition, by performing post-annealing, it is possible to improve the piezoelectric characteristics of the piezoelectric body layer 70 and perform homogenization of the piezoelectric characteristics.

Figure 10B:
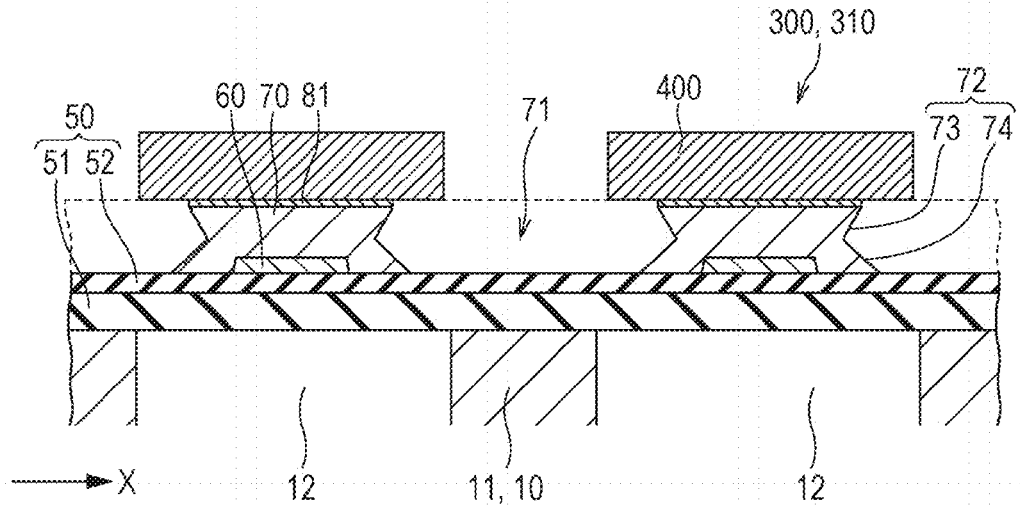

Next, as shown in FIG. 10B, the piezoelectric body layer 70 is patterned to correspond to the pressure generation chambers 12. In the present embodiment, a mask 400 is provided on the first layer 81 and on the piezoelectric body layer 70, and the piezoelectric body layer 70 is patterned by performing wet etching through the mask. As a result of this, the first opening section 71 is formed on the piezoelectric body layer 70, and the groove sections 72, which include the first surfaces 73 and the second surfaces 74, are simultaneously formed on the side surfaces of the piezoelectric body layer 70, that is, the inner side surfaces of the first opening section 71 in the first direction X. That is, since the piezoelectric body layer 70 is configured by a plurality of the piezoelectric body films 170 being laminated, it is easy to selectively remove the interfaces thereof using wet etching. Therefore, the groove sections 72, in which the interfaces of the piezoelectric body films 170 are concave, are suitably formed. Incidentally, for example, the shapes of the groove sections 72 can be adjusted by adjusting the composition of an etching liquid that is used in the wet etching. In addition, it is also possible to form the groove sections 72 in a desired shape by changing the composition of the laminated piezoelectric body films 170. Furthermore, after the film formation and patterning of the first layer 81 on the surface of the piezoelectric body layer 70 has been performed, since the piezoelectric body layer 70 is patterned, it is considered that the shape of the groove sections 72 is also determined by the influence when performing film formation and patterning of the first layer 81. In the present embodiment, the groove sections 72 can be easily formed without adding a step of wet etching the piezoelectric body layer 70.

Figure 11A:
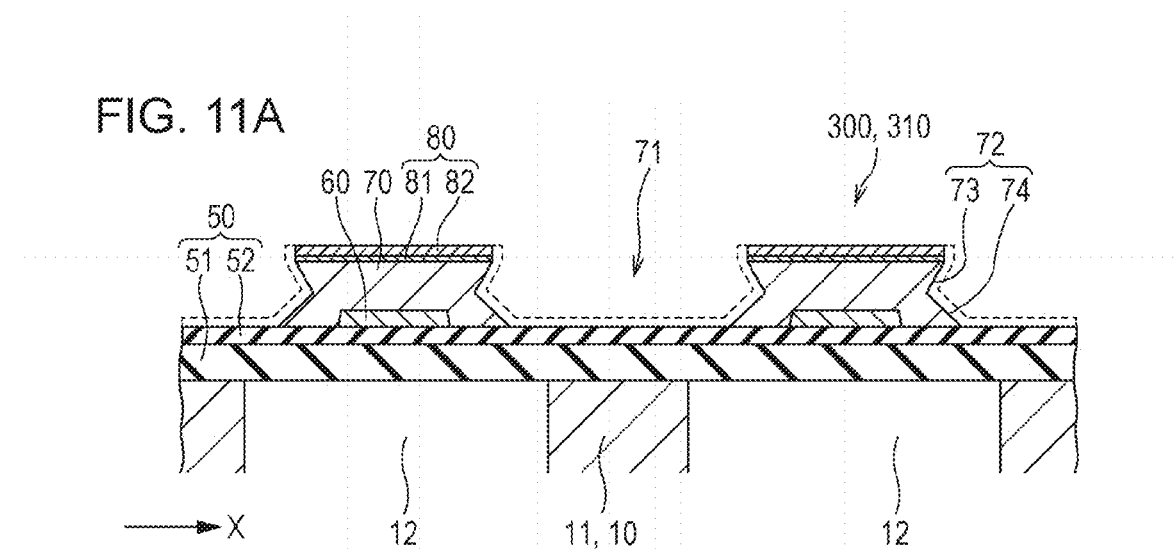
FIGS. 11A to 11C are cross-sectional views that show a manufacturing method of a recording head according to Embodiment 1 of the invention.

Next, as shown in FIG. 11A, the second electrode 80 is formed by forming the second layer 82 throughout a surface side (a surface side on which the piezoelectric body layer 70 is formed) of the flow path formation substrate wafer 110, that is, on the first layer 81, on the side surfaces on which the piezoelectric body layer 70 is patterned, on the insulating body film 52, and on the first electrode 60, and patterning the second layer 82 in a predetermined shape. In addition, although not specifically shown in the drawings, the removal section 83 and the like are formed by patterning the second electrode 80.

Figure 11B:
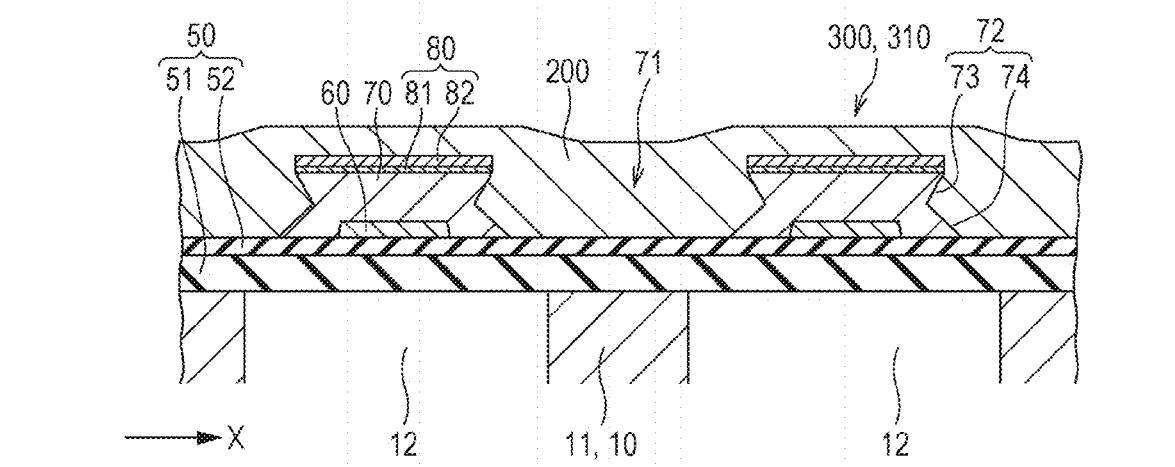

Next, the stress application film 200 is formed. Firstly, as shown in FIG. 11B, the stress application film 200 is formed throughout a surface of the flow path formation substrate wafer 110. The material of the stress application film 200 is not particularly limited as long as internal stress becomes tensile stress, and it is possible to use an inorganic material or an organic material. Additionally, an inorganic material stress application film 200 can, for example, be formed using a gas phase film formation such as an MOD method, a sol-gel method, a sputtering method, or a CVD method. In addition, an organic material stress application film 200 can, for example, be formed using a liquid phase film formation such as a spin coating method, a spray method, or a slit coating method. In the present embodiment, as the stress application film 200, a photosensitive polyimide is formed to be thicker than the thickness of the piezoelectric element 300 using a spin coating method.

Figure 11C:
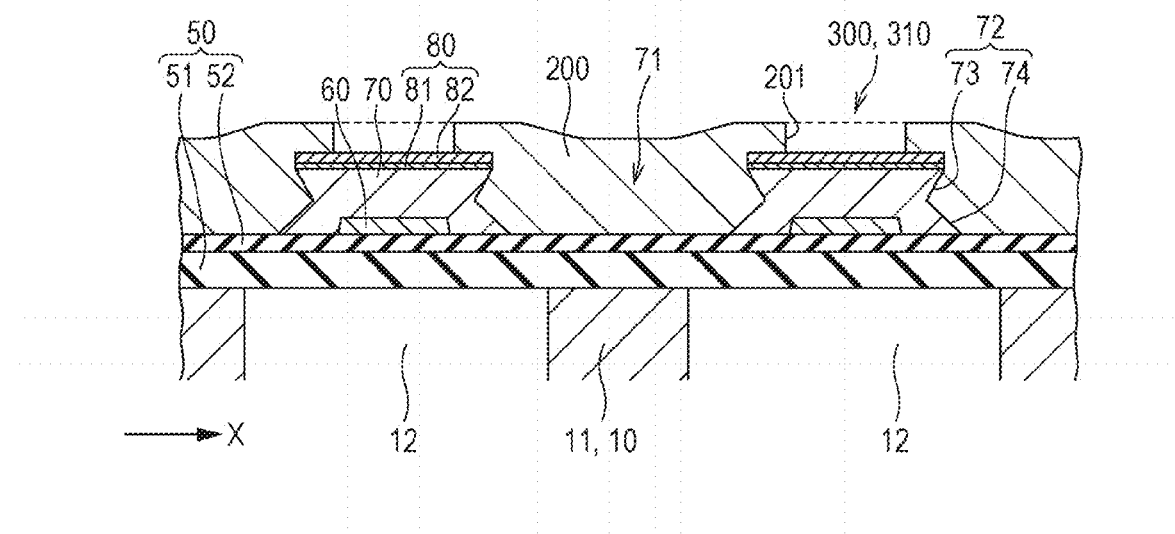

Next, as shown in FIG. 11C, the second opening section 201 and the like are formed by patterning the stress application film 200 in a predetermined shape. In the present embodiment, the stress application film 200 of a predetermined shape is formed by exposing and developing the photosensitive polyimide. In this manner, as a result of using a photosensitive resin as the stress application film 200, it is possible to suppress a circumstance in which a portion of the vibration plate 50, second electrode 80, the piezoelectric body layer 70 or the like is removed as a result of over-etching due to dry etching by patterning the control unit 200 without using dry etching or the like.

In addition, in a case in which an insulating film is used in the stress application film 200, the stress application film 200 may also be formed on the removal section 83. In this case, the stress application film 200 can be set as a protective film that protects the piezoelectric body layer 70, which is exposed by the removal section 83.

Figure 12A:
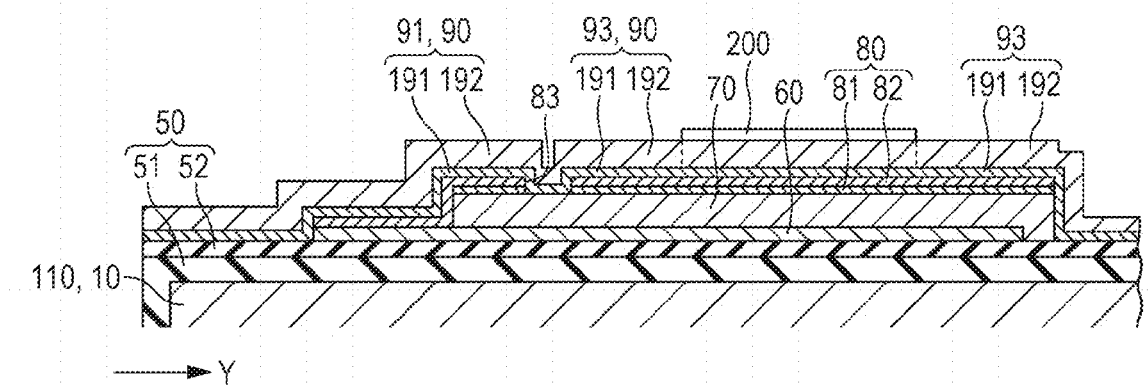
FIGS. 12A and 12B are cross-sectional views that show a manufacturing method of a recording head according to Embodiment 1 of the invention.

Next, as shown in FIG. 12A, the lead electrode 90 is formed throughout the entirety of a surface of the flow path formation substrate wafer 110. In the present embodiment, the lead electrode 90 is formed by laminating the adhesive layer 191 and the conductive layer 192.

Figure 12B:
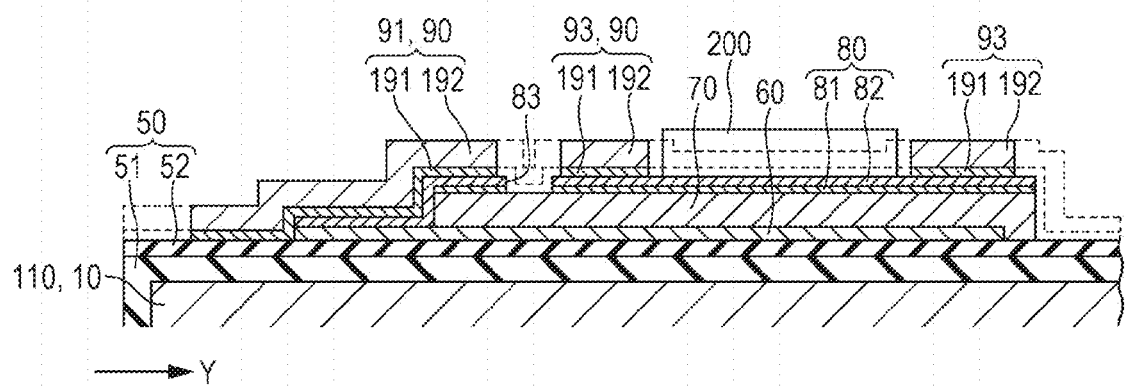

Next, as shown in FIG. 12B, the lead electrode 90 is patterned in a predetermined shape. In the patterning of the lead electrode 90, patterning may be performed by performing wet etching of the adhesive layer 191 after first patterning the conductive layer 192 using wet etching or the like.

Figure 13A:
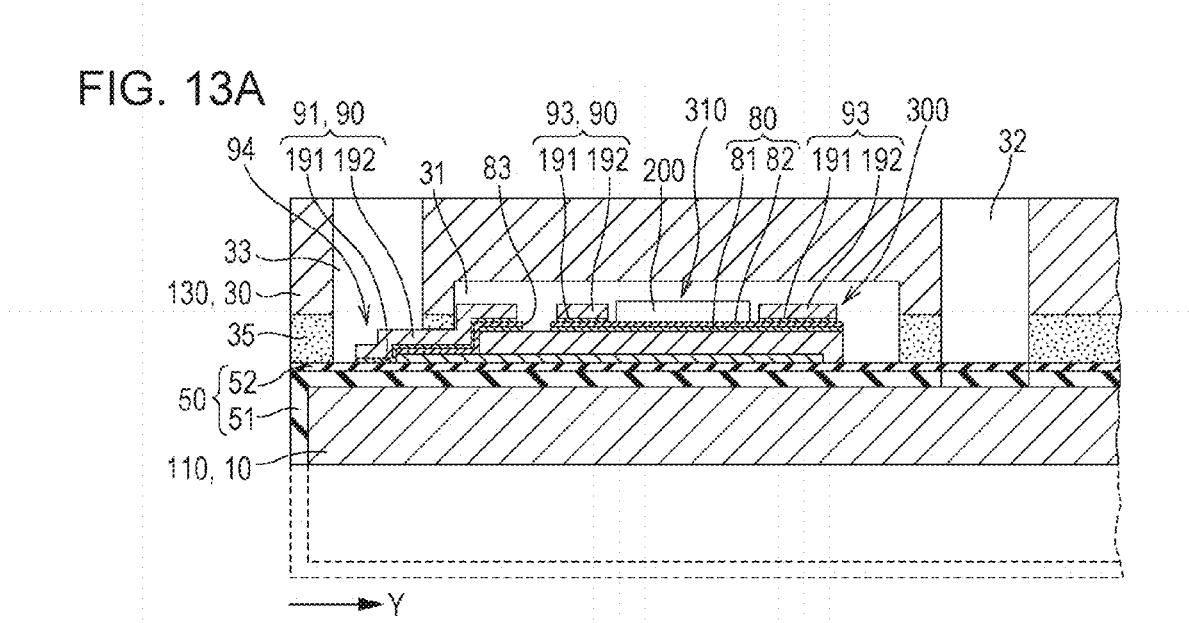
FIGS. 13A to 13C are cross-sectional views that show a manufacturing method of a recording head according to Embodiment 1 of the invention.

Next, as shown in FIG. 13A, the flow path formation substrate wafer 110 is thinned to a predetermined thickness after the protective substrate wafer 130, which is a silicon wafer and forms a plurality of protective substrates 30 that are, is joined to the piezoelectric element 300 side of the flow path formation substrate wafer 110 using an adhesive 35.

Figure 13B:
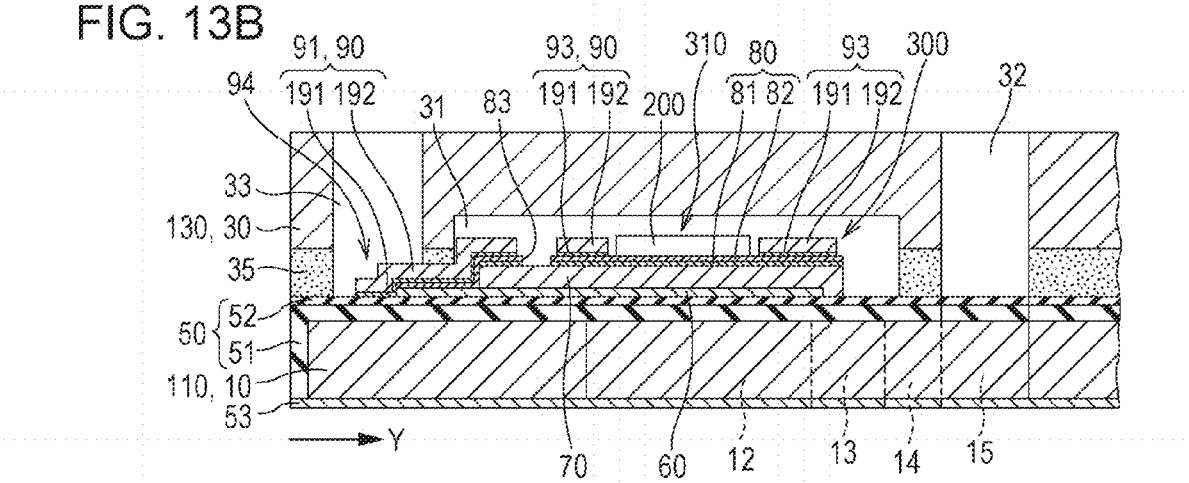
Figure 13C:
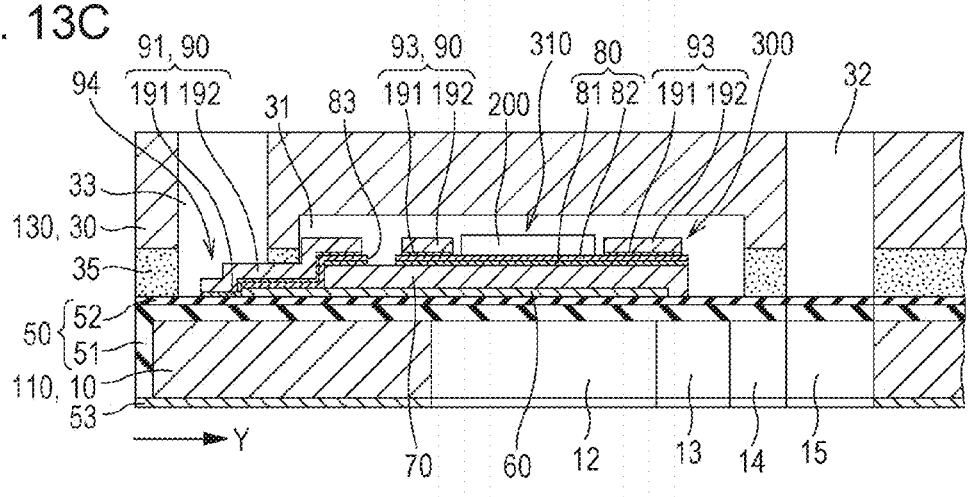

Next, as shown in FIG. 13B, a mask 53 is newly formed on the flow path formation substrate wafer 110, and patterning is performed in a predetermined shape. Further, as shown in FIG. 13C, the pressure generation chambers 12 that correspond to the piezoelectric element 300, the ink supply channels 13, the communication channels 14 and the communication section 15 are formed by performing anisotropic etching (wet etching) of the flow path formation substrate wafer 110 using an alkali solution such as a KOH via the mask film 53. As a result of this, the constraints of the flow path formation substrate wafer 110 (the vibration plate 50) are resolved, and the piezoelectric element 300 becomes deformed in the manner that is shown in FIGS. 6A and 6B due to the influence of internal stress.

Subsequently, unnecessary portions of the outer peripheral edge portions of the flow path formation substrate wafer 110 and the protective substrate wafer 130 are removed by cutting using dicing or the like, for example. Further, in addition to joining the nozzle plate 20, into which the nozzle openings 21 are drilled, to a surface on a side of the flow path formation substrate wafer 110 that is opposite to the protective substrate wafer 130, the compliance substrate 40 is joined to the protective substrate wafer 130, and the ink jet type recording head of the present embodiment is configured by dividing the flow path formation substrate wafer 110 and the like into flow path formation substrates 10 with a single chip size such as that shown in FIG. 1.

Incidentally, the piezoelectric body layer 70 was formed using the abovementioned manufacturing method, and the stress application film 200 that is formed from a photosensitive resin was formed, and the components were observed using scanning electron microscope (SEM). The results are shown in FIG. 14.

As shown in FIG. 14, the groove section 72, which has the first surface 73 and the second surface 74 is provided in the piezoelectric body layer 70, and the stress application film 200 is formed adhered inside the groove section 72 in a manner that covers the first surface 73 and the second surface 74. That is, the stress application film 200 that is formed from a photosensitive resin can be formed with favorable coverage on the side surface of the piezoelectric body layer 70 in which the groove section 72 is provided.

Embodiment 2

Figure 15:
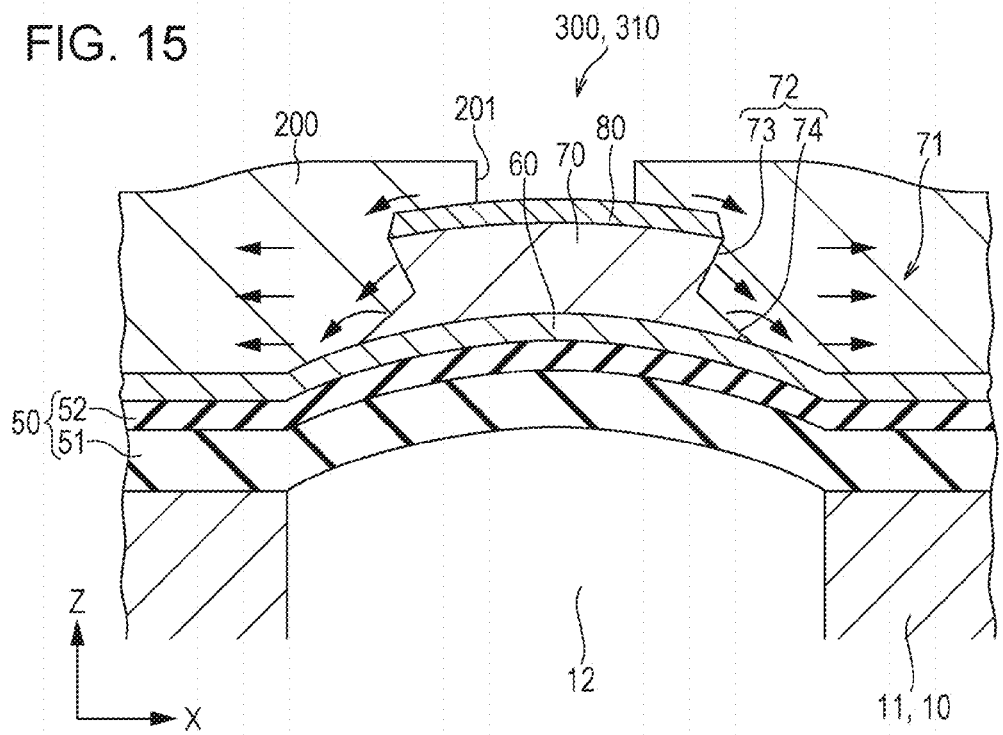
FIG. 15 is a cross-sectional view in which the main sections of a recording head according to Embodiment 2 of the invention have been expanded.

FIG. 15 is a cross-sectional view in which the main sections of an ink jet type recording head, which is an example of a liquid ejecting head according to Embodiment 2 of the invention, have been expanded. Additionally, the same symbols are applied to the same members as the abovementioned Embodiment 1, and overlapping description thereof is omitted.

As shown in FIG. 15, in the piezoelectric element 300 of the present embodiment, the first electrode 60 configures a common electrode that is common throughout a plurality of active sections 310, and the second electrode configures individual electrodes of each active section 310.

In addition, the groove sections 72, which include the first surfaces 73 and the second surfaces 74 are provided on the side surfaces of the piezoelectric body layer 70. In addition, the stress application film 200, which includes the second opening section 201, is provided in the piezoelectric element 300.

In such a configuration, it is also possible to apply a raising stress to the piezoelectric element 300 on a side that is opposite to the flow channel formation substrate 10 by forming the groove sections 72 on the side surfaces of the piezoelectric body layer 70 and providing the stress application film 200, which includes the second opening section 201, and therefore, it is possible to realize a high displacement efficiency piezoelectric element 300.

Other Embodiments

Each embodiment of the invention was described above, but the basic configuration of the invention is not limited to the descriptions mentioned above.

Figure 16:
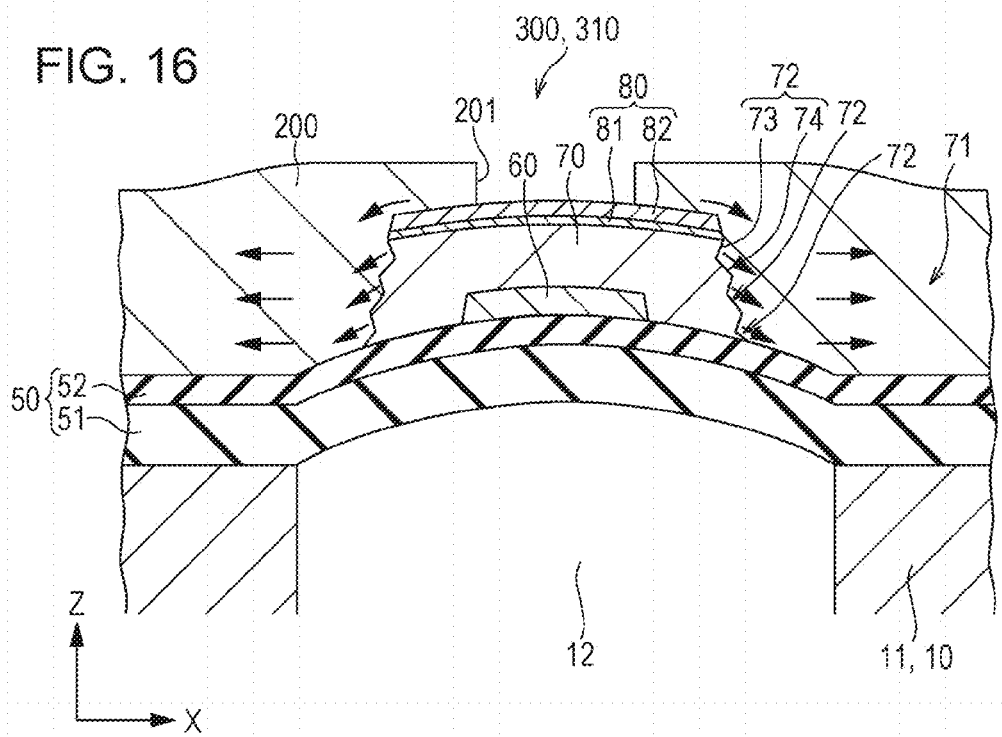
FIG. 16 is a cross-sectional view in which the main sections of a recording head according to another embodiment of the invention have been expanded.

For example, Embodiments 1 and 2 mentioned above, a configuration in which a single groove section 72 only was provided on the side surfaces of the piezoelectric body layer 70 was set, but the number of the groove sections 72 is not particularly limited to this. For example, as shown in FIG. 16, three groove sections 72 may be formed on a single side surface of the piezoelectric body layer 70. Naturally, the number of the groove sections 72 is not limited to three, and may be one, or may be a plurality of two or more. Even in a case in which a plurality of groove sections 72 are provided on a single side surface of the piezoelectric body layer 70 in this manner, it is possible to apply a stress moment that pulls the first surfaces 73 of the groove sections 72 tight on a flow channel formation substrate 10 side in the third direction Z, and therefore, it is possible to improve the raising effect of the piezoelectric element 300. Additionally, the plurality of groove sections 72 can, for example, be easily formed by providing a plurality of interfaces of the piezoelectric body film 170, and performing wet etching of the piezoelectric body layer 70 in the same manner as Embodiment 1 mentioned above.

In addition, in Embodiments 1 and 2 mentioned above, groove sections 72 that include the first surfaces 73 and the second surfaces 74, which form inclined surfaces, that is, groove sections 72 that are cut out in a V-shape (a cross-section of which is triangular) are provided, but as long as the groove sections 72 include the first surfaces 73 that relatively face the vibration plate 50, the shape thereof is not limited to the shape mentioned above. In this instance, other examples of the groove sections are shown in FIGS. 17 and 18.

Figure 17:
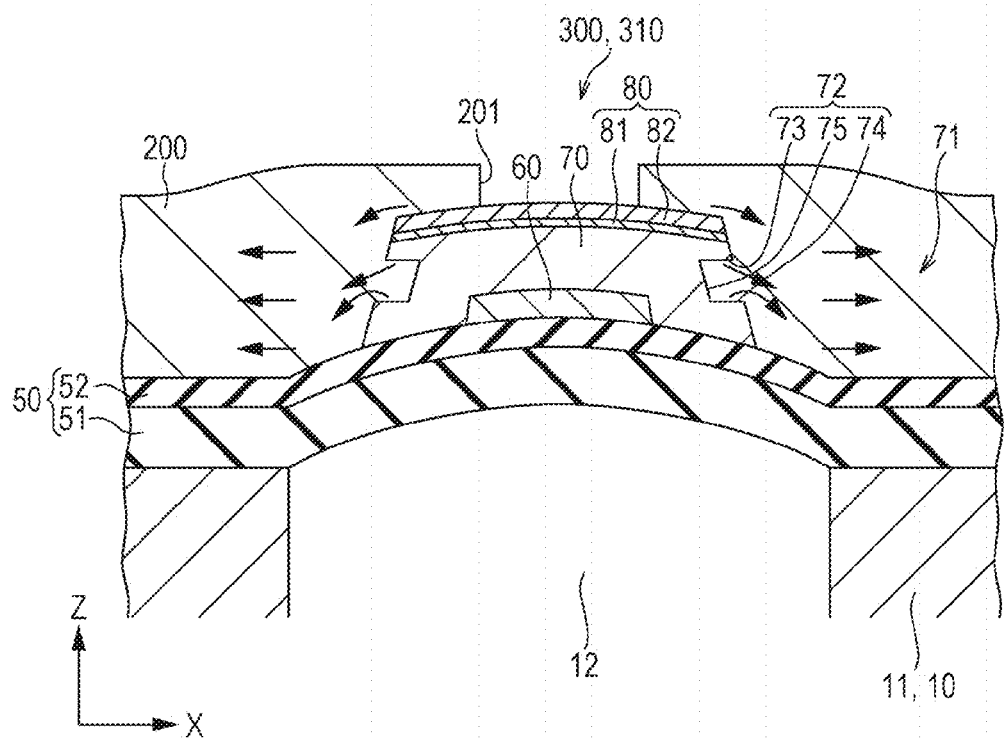
FIG. 17 is a cross-sectional view that shows a manufacturing method of a recording head according to another embodiment of the invention.

As shown in FIG. 17, the groove sections 72, which are provided on the side surfaces of the piezoelectric body layer 70, are provided with first surfaces 73 and second surfaces 74 that are provided to be substantially parallel to surfaces that include the first direction X and the second direction Y, and third surfaces 75 that are continuous with the first surfaces 73 and the second surfaces 74. That is, the groove sections 72 are formed by cutting out the side surfaces of the piezoelectric body layer 70 in a manner in which a cross-section thereof forms a rectangular shape. Even if the groove sections 72 have this kind of configuration, it is possible to apply a stress moment that pulls the first surfaces 73 tight on a flow channel formation substrate 10 side in the third direction Z, and therefore, it is possible to improve the raising effect of the piezoelectric element 300.

Figure 18:
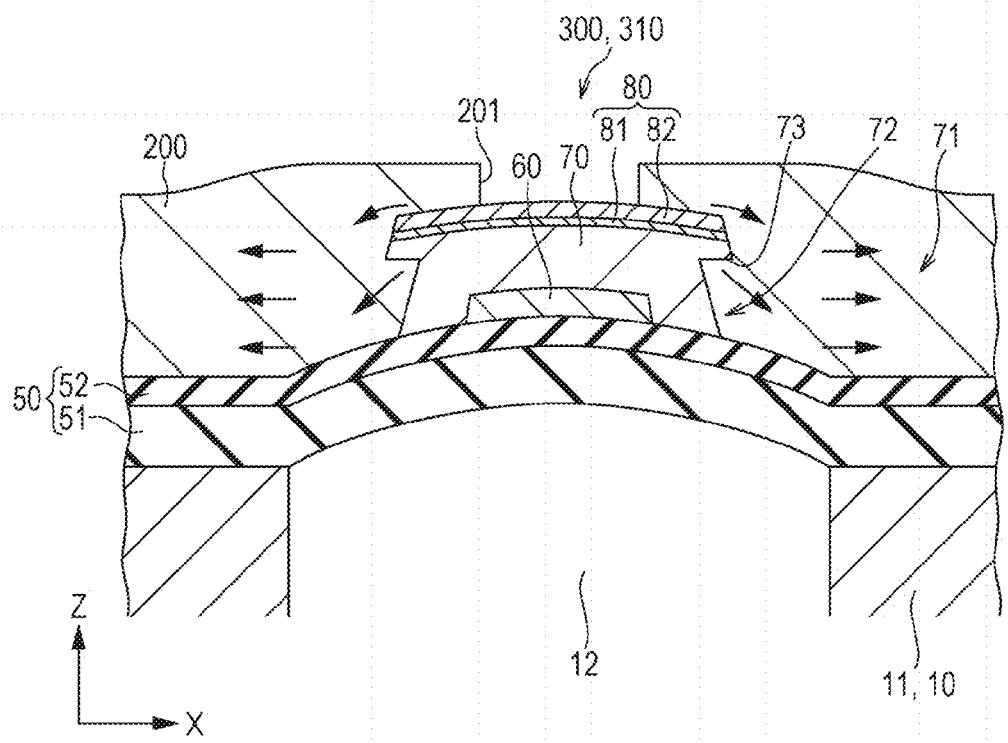
FIG. 18 is a cross-sectional view that shows a manufacturing method of a recording head according to still another embodiment of the invention.

In addition, as shown in FIG. 18, the groove sections 72 are formed by step that is caused by a difference in width in the side surfaces as a result of the piezoelectric body layer 70 being formed so that a width in the first direction X is narrow on the vibration plate 50 side, and wide on the second electrode 80 side. That is, only first surfaces 73, which are provided to be substantially parallel to surfaces that include the first direction X and the second direction Y, are provided in the groove sections 72. Even if the groove sections 72 have this kind of configuration, it is possible to apply a stress moment that pulls the first surfaces 73 tight on a flow channel formation substrate 10 side in the third direction Z, and therefore, it is possible to improve the raising effect of the piezoelectric element 300.

Additionally, piezoelectric body layers 70 that include the groove sections 72 of FIG. 17 and FIG. 18 can be formed by performing film formation of the piezoelectric body film 170 and patterning of the formed piezoelectric body film 170 divided into a plurality of times using a mask or the like. In addition, in a case in which the groove sections 72 are formed by dividing patterning of the piezoelectric body film 170 into a plurality of times, patterning may also be performed using dry etching in addition to only wet etching.

In addition, in Embodiment 1 mentioned above, a configuration in which the piezoelectric body layer 70 of each active section 310 is provided continuously was illustrated by way of example, but naturally, the piezoelectric body layer 70 may be provided independently for each active section 310. That is, the first opening section 71 may be provided throughout the second direction Y, and the piezoelectric body layer 70 may be completely separated for each active section 310. In addition, in Embodiment 1 mentioned above, the second electrode 80 is set to be an electrode in which the first layer 81 and the second layer 82 are laminated, but the second electrode 80 is not particularly limited to this, and may be a single layer or an electrode in which three or more layers are laminated. That is, in Embodiment 1 mentioned above, the second electrode 80 may be configured by the first layer 81 only. Naturally, the second electrode 80 of Embodiment 2 may also be configured by the first layer 81 and the second layer 82 in the same manner as Embodiment 1, or may be an electrode in which three or more layers are laminated.

In addition, in Embodiments 1 and 2 mentioned above, a configuration in which the pressure generation chambers 12, which are concave sections are provided to penetrate into the flow channel formation substrate 10, which is a substrate, in the third direction Z, which is a thickness direction, was illustrated by way of example, but the configuration is not particularly limited to this, and for example, a configuration in which the pressure generation chambers 12 are not be provided to penetrate the flow channel formation substrate 10 in the third direction Z, may also be used. That is, a configuration in which the pressure generation chambers 12 are provided to be open on the vibration plate 50 side, and the pressure generation chambers 12 and the nozzle openings 21 communicate with one another through a nozzle communication path, may also be used. In addition, a configuration in which the pressure generation chambers 12 are provided so as to be open on the nozzle opening 21 side, a portion of the piezoelectric element 300 side of the flow channel formation substrate 10 is left behind, and the remaining portion is used as a portion of the vibration plate, may also be used. In other words, the concave sections include sections that penetrate substrates such as the flow channel formation substrate 10 in the thickness direction, and sections that are open on any one surface only.

Figure 19:
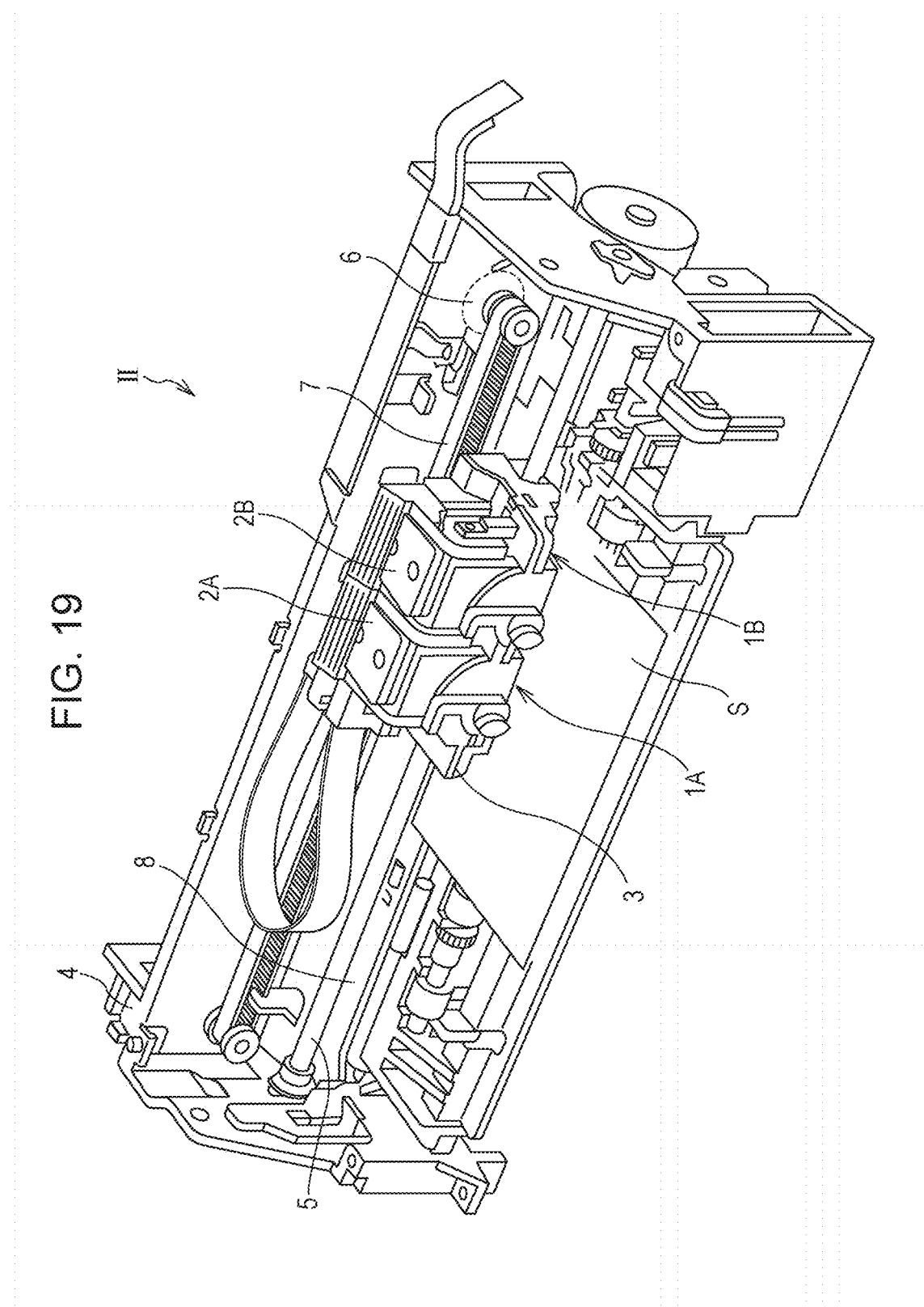
FIG. 19 is a schematic view that shows a liquid ejecting apparatus according to an embodiment of the invention.

In addition, as shown in FIG. 19, the ink jet type recording head I is for example, installed in an ink jet type recording apparatus II.

As shown in FIG. 19, in recording head units 1A and 1B, which include the ink jet type recording heads I, cartridges 2A and 2B, which configure an ink supply unit, are provided in a detachable manner, and a carriage 3, in which the recording head units 1A and 1B are installed, is provided on a carriage shaft 5, which is attached to an apparatus main body 4, in a manner in which the carriage 3 is movable in an axial direction. For example, the recording head units 1A and 1B eject a black ink composition and a color ink composition.

Further, the carriage 3, in which the recording head units 1A and 1B are installed, moves along the carriage shaft 5 as a result of a driving force of a driving motor 6 being transmitted to the carriage 3 via a plurality of gear wheels, which are not illustrated, and a timing belt 7. Meanwhile, a transport roller 8 is provided in the apparatus main body 4 as a transport unit, and recording sheets S, which are a recording medium such as paper, are transported by the transport roller 8. Additionally, the transport unit that transports the recording sheets S is not limited to a transport roller, and may be a belt, a drum or the like.

Additionally, an ink jet type recording apparatus in which the ink jet type recording head I is installed in the carriage 3 and moves in a main scanning direction was illustrated as an example of the ink jet type recording apparatus II, but the configuration thereof is not particularly limited. For example, the ink jet type recording apparatus II may be a so-called line type recording apparatus in which the ink jet type recording head I is fixed, and which performs printing by moving recording sheets S such as paper in a sub-scanning direction.

In addition, in the abovementioned examples, the ink jet type recording apparatus II has a configuration in which the cartridges 2A and 2B, which are liquid accumulation units, are installed in the carriage 3, but the configuration is not particularly limited to this, and for example, a liquid accumulation unit such as an ink tank may be fixed to the apparatus main body 4, and the liquid accumulation unit and the ink jet type recording head I may be connected via a supply pipe such as a tube. In addition, the liquid accumulation unit need not be installed in the ink jet type recording apparatus.

Additionally, in the present embodiment, description was given using an ink jet type recording head as an example of a liquid ejecting head, and an ink jet type recording apparatus as an example of a liquid ejecting apparatus, but the invention can be widely applied to general liquid ejecting heads and liquid ejecting apparatuses, and naturally, can be suitably applied to liquid ejecting heads and liquid ejecting apparatuses that eject liquids other than ink. Examples of other liquid ejecting heads include various recording heads that are used in image recording apparatuses such as printers, color material ejecting heads that are used in the production of color filters such as liquid crystal displays, electrode material ejecting heads that are used in electrode formation such as organic EL displays, field emission displays (FEDs) and the like, and living organic material ejecting heads that are used in the production of biochips.

The invention can also be applied to liquid ejecting apparatuses that are provided with such liquid ejecting heads.

In addition, the present invention is not limited to a piezoelectric device having a piezoelectric element that is installed in a liquid ejecting head that can be represented by an ink jet type recording head, and can be applied other piezoelectric devices that are used in ultrasonic wave apparatuses such as ultrasonic wave transmitters, ultrasonic wave motors, pressure sensors, pyroelectric sensors, and the like.

The entire disclosure of Japanese Patent Application No. 2014-191789, filed Sep. 19, 2014 is expressly incorporated by reference herein.

What is claimed is:

1. A piezoelectric device comprising:
   a substrate having first and second surface opposite to each other;
   a vibration plate on the first surface of the substrate;
   a piezoelectric element including:
      a first electrode provided on the vibration plate;
      a piezoelectric body layer provided on the first electrode;
      a groove provided on a side surface of the piezoelectric body layer, the groove including a first groove surface facing to the vibration plate; and
      a second electrode provided on the piezoelectric body layer; and
   a stress application film having tensile stress and provided on an inner surface of the groove,
   wherein the stress application film is provided to reach up to an upper surface of the second electrode on a side that is opposite to the piezoelectric body layer, and an opening section is provided in a region of the stress application film that corresponds to a central section of an upper surface of the piezoelectric element.

2. The piezoelectric device according to claim 1,
   wherein the first groove surface of the groove is inclined with respect to a lamination direction of the first electrode, the piezoelectric body layer, and the second electrode, and the first groove surface of the groove is an inclined surface that is inclined with respect to a top surface of the vibration plate.

3. The piezoelectric device according to claim 1,
   wherein the groove includes a second groove surface that is provided toward a side of the second electrode, the second groove surface is inclined with respect to a lamination direction of the first electrode, the piezoelectric body layer, and the second electrode, and the second groove surface is an inclined surface that is inclined with respect to a top surface of the vibration plate.

4. The piezoelectric device according to claim 1,
   wherein a first thickness of the stress application film from the vibration plate is greater than or equal to 100% and less than or equal to 200% with respect to a second thickness of the piezoelectric element from the vibration plate.

5. The piezoelectric device according to claim 1,
   wherein internal stress in the second electrode is compressive stress.

6. The piezoelectric device according to claim 1,
   wherein the stress application film is a photosensitive resin.

7. A liquid ejecting head comprising:
   the piezoelectric device according to claim 1:
   a pressure generation chamber that is formed in the substrate: and
   nozzle openings that communicate with the pressure generation chamber and eject a liquid.

8. A liquid ejecting apparatus comprising:
   liquid ejecting head according to claim 7.

9. A manufacturing method of a piezoelectric device comprising:
   preparing a substrate having first and second surfaces opposite to each other;
   providing a vibration plate on the first surface of the substrate;
   providing a first electrode on the vibration plate;
   providing a piezoelectric body layer on the first electrode, a groove being provided on a side surface of the piezoelectric body layer, and the groove including a first groove surface facing to the vibration plate;
   providing a second electrode on the piezoelectric body layer; and
   providing a stress application film having tensile stress inside, on an inner surface of the groove,
   wherein the stress application film is provided to reach up to an upper surface of the second electrode on a side that is opposite to the piezoelectric body layer, and an opening section is provided in a region of the stress application film that corresponds to a central section of an upper surface of the piezoelectric body layer.

10. The manufacturing method of a piezoelectric device according to claim 9,
    wherein a plurality of the grooves are formed simultaneously by forming a laminate of a plurality of piezoelectric body layers and patterning the laminate using wet etching.

11. The manufacturing method of a piezoelectric device according claim 9,
    wherein the stress application film is formed by a liquid phase method.

12. A piezoelectric device comprising:
    a substrate having first and second surfaces opposite to each other;
    a vibration plate on the first surface of the substrate;
    a piezoelectric element including:
       a first electrode provided on the vibration plate;
       a piezoelectric body layer provided on the first electrode;
       a groove provided on a side surface of the piezoelectric body layer, the groove including a first groove surface facing to the vibration plate; and
       a second electrode provided on the piezoelectric body layer; and
    a stress application film having tensile stress and provided on an inner surface of the groove,
    wherein a first thickness of the stress application film from the vibration plate is greater than or equal to 100% and less than or equal to 200% with respect to a second thickness of the piezoelectric element from the vibration plate.

13. A piezoelectric device comprising:
    a substrate having first and second surfaces opposite to each other;
    a vibration plate on the first surface of the substrate;
    a piezoelectric element including:
       a first electrode provided on the vibration plate;
       a piezoelectric body layer provided on the first electrode;
       a groove provided on a side surface of the piezoelectric body layer, the groove including a first groove surface facing to the vibration plate; and a second electrode provided on the piezoelectric body layer; and a stress application film having tensile stress and provided on an inner surface of the groove, wherein a plurality of the piezoelectric elements are provided on the vibration plate including a first piezoelectric body layer and a second piezoelectric body layer, and the stress application film is continuously provided at an entirety between the groove of the first piezoelectric body layer and the groove of the second piezoelectric body layer on the vibration plate.

* * * * *